US012426185B2

(12) United States Patent
Hettler et al.

(10) Patent No.: US 12,426,185 B2
(45) Date of Patent: Sep. 23, 2025

(54) COMPOSITE ELEMENT

(71) Applicant: Schott AG, Mainz (DE)

(72) Inventors: Robert Hettler, Kumhausen (DE); Wee Kiat Chai, Singapore (SG); Rainer Graf, Landshut (DE); Helena Haslbeck, Frontenhausen (DE)

(73) Assignee: Schott AG, Mainz (DE)

( * ) Notice: Subject to any disclaimer, the term of this patent is extended or adjusted under 35 U.S.C. 154(b) by 265 days.

(21) Appl. No.: 18/113,929

(22) Filed: Feb. 24, 2023

(65) Prior Publication Data
US 2024/0023262 A1    Jan. 18, 2024

Related U.S. Application Data

(63) Continuation of application No. PCT/EP2021/073387, filed on Aug. 24, 2021.

(30) Foreign Application Priority Data

Aug. 24, 2020  (EP) ..................................... 20192446

(51) Int. Cl.
H05K 5/03    (2006.01)
H05K 5/04    (2006.01)
(52) U.S. Cl.
CPC .................. H05K 5/03 (2013.01); H05K 5/04 (2013.01)
(58) Field of Classification Search
CPC ...... G06F 1/1626; G06F 1/163; G06F 1/1633; G06F 1/1656; H05K 5/03; H05K 5/04
See application file for complete search history.

(56) References Cited

U.S. PATENT DOCUMENTS

| 2,392,314 | A | * | 1/1946 | Dalton | C03C 27/02 |
| | | | | | 501/15 |
| 2,845,773 | A | | 8/1958 | Sakalys | |
| 3,203,715 | A | * | 8/1965 | Benbenek | H01J 5/26 |
| | | | | | 285/329 |
| 3,355,873 | A | * | 12/1967 | Morf | G04B 37/066 |
| | | | | | 368/292 |
| 3,640,065 | A | * | 2/1972 | Lederrey | G04B 39/02 |
| | | | | | 368/292 |

(Continued)

FOREIGN PATENT DOCUMENTS

EP      3 623 878 A1    3/2020

OTHER PUBLICATIONS

International Search Report dated Dec. 8, 2021 for International Application No. PCT/EP2021/073387 (5 pages).

Primary Examiner — Adrian S Wilson
(74) Attorney, Agent, or Firm — TAYLOR & EDELSTEIN, PC

(57) ABSTRACT

A composite element includes: an outer holder; and an inner component which is held in the outer holder under a compressive stress, the outer holder and the inner component adjoining one another along a contour line which is closed, the contour line including two linear portions and two connecting portions, the two linear portions opposing one another and extending in a straight line, the two connecting portions connecting the two linear portions to form the contour line as closed, at least one of the two connecting portions having an arcuately extending curved region.

22 Claims, 29 Drawing Sheets
(24 of 29 Drawing Sheet(s) Filed in Color)

(56) References Cited

U.S. PATENT DOCUMENTS

| | | | | |
|---|---|---|---|---|
| 3,675,414 A * | 7/1972 | Cachelin | ................ | G04B 37/05 |
| | | | | 968/294 |
| 4,440,505 A | 4/1984 | Gogniat | | |
| 4,594,008 A | 6/1986 | Affolter | | |
| 4,926,401 A | 5/1990 | Vuilleumier et al. | | |
| 8,920,022 B2 * | 12/2014 | Ishida | ................ | G04B 37/106 |
| | | | | 368/320 |
| 10,018,966 B2 * | 7/2018 | Ely | ................ | G04G 21/00 |
| 10,222,837 B1 * | 3/2019 | Budinich | ................ | G06F 1/1656 |
| 10,429,892 B1 * | 10/2019 | Mathew | ................ | H10K 59/87 |
| 10,599,101 B2 * | 3/2020 | Rothkopf | ................ | A61B 5/0245 |
| 11,194,298 B2 * | 12/2021 | Roach | ................ | G04G 9/007 |
| 11,474,483 B2 * | 10/2022 | Rothkopf | ................ | A61B 5/681 |
| 2020/0384587 A1 | 12/2020 | Ott | | |

\* cited by examiner

FIG. 7
(a)
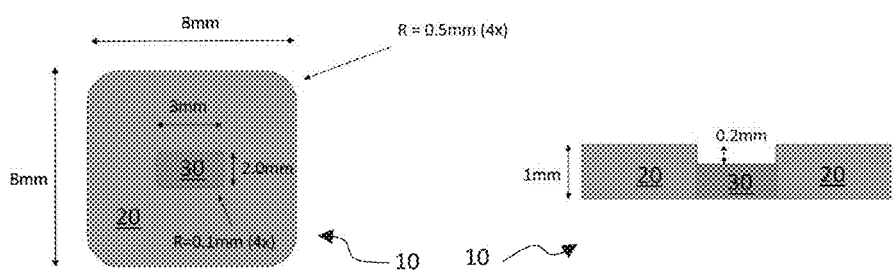
(b)
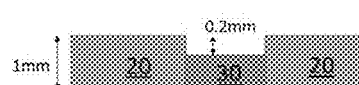
(c)
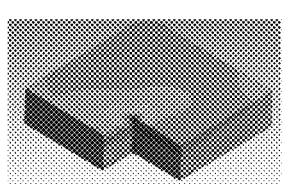
(d)
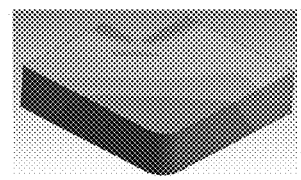
(e)
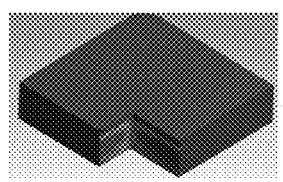
(f)
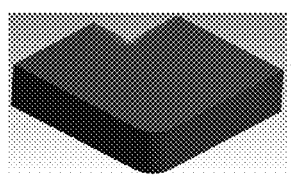
(g)
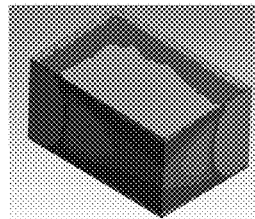
(h)
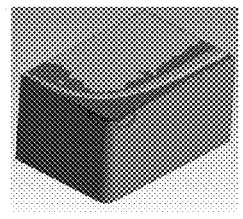
(i)
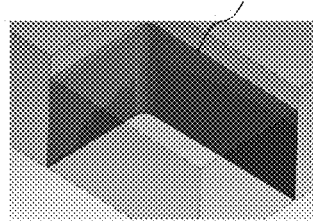

FIG. 10
(a) 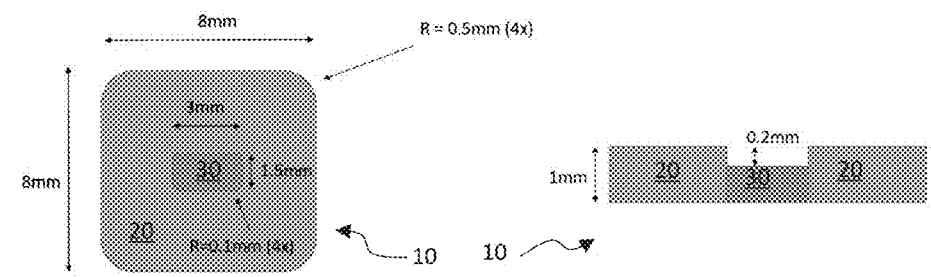  (b) 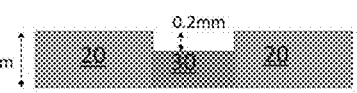
(c) 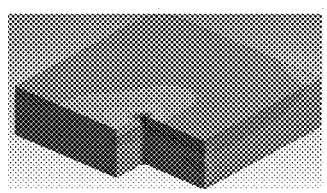  (d) 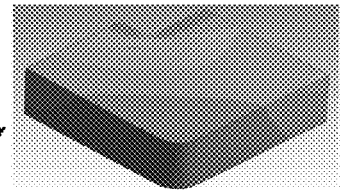
(e) 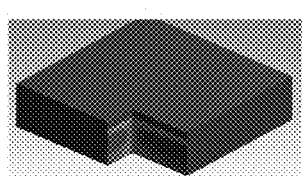  (f) 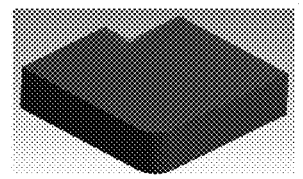
(g) 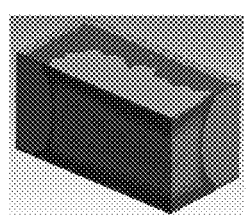  (h) 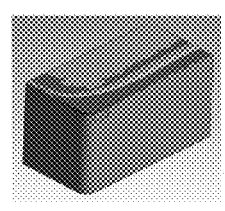
(i) 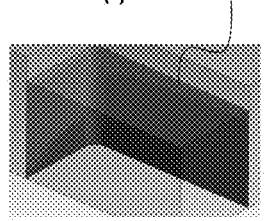

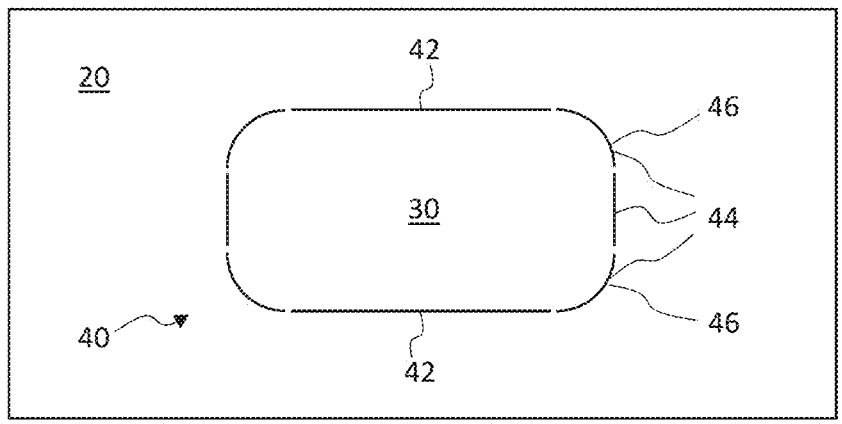
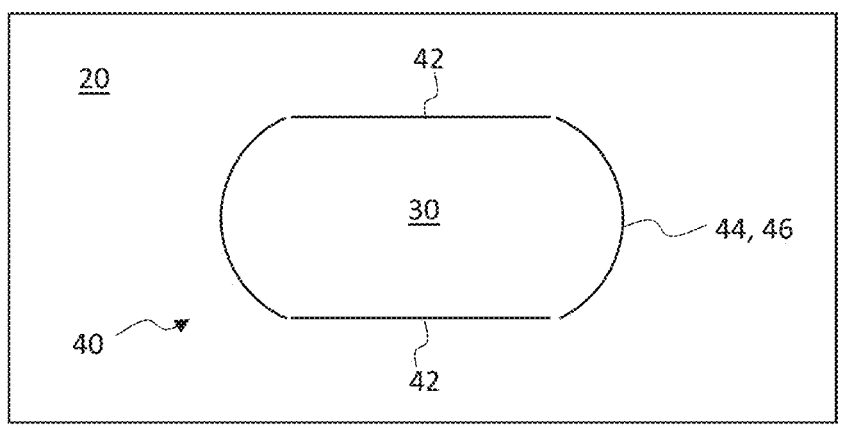

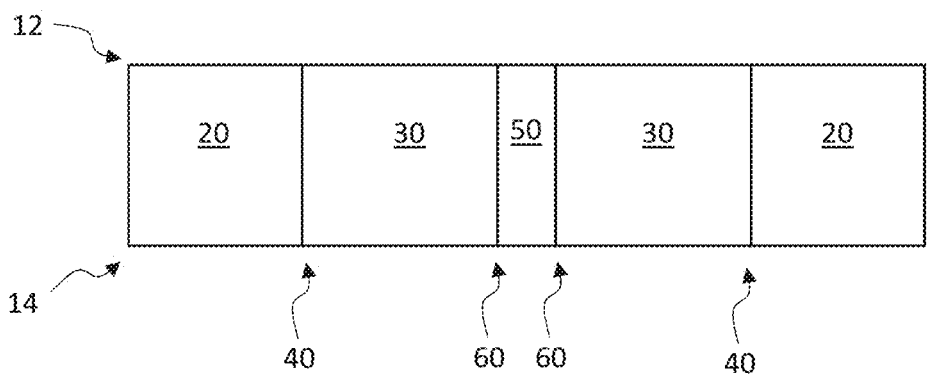
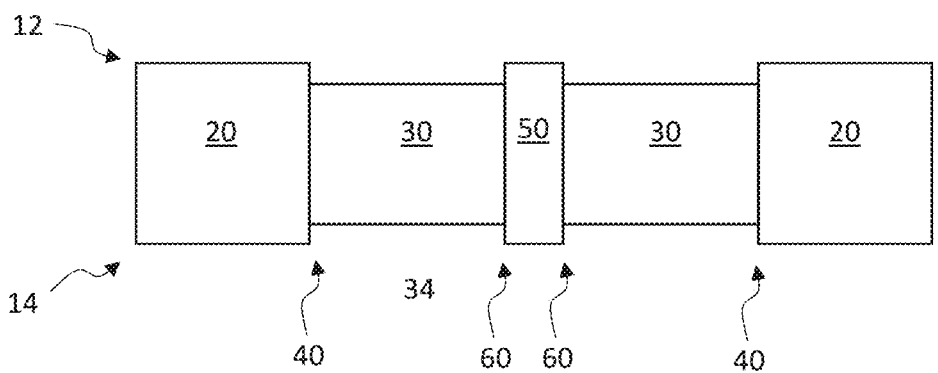

FIG. 25
(a)
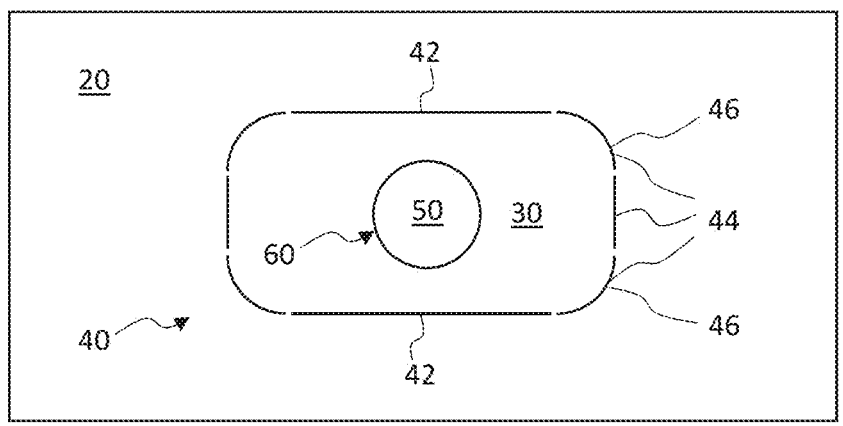
(b)
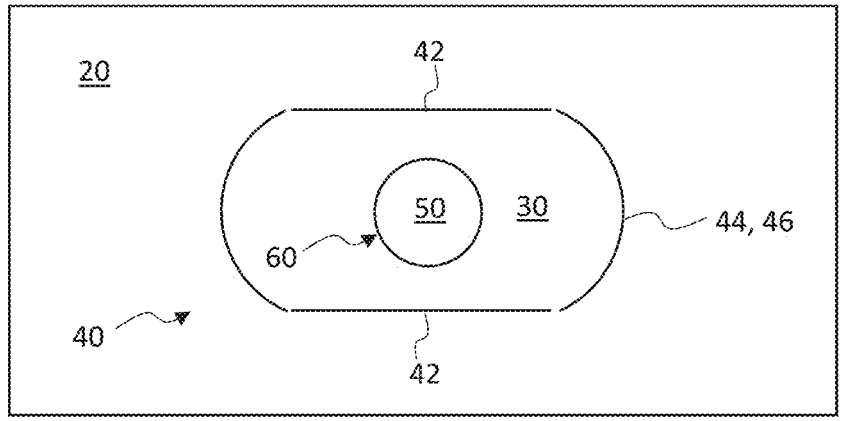

FIG. 26
(a)
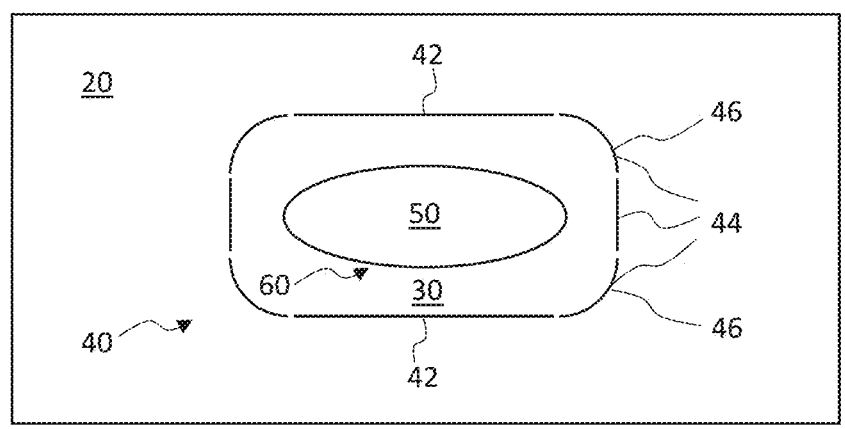
(b)
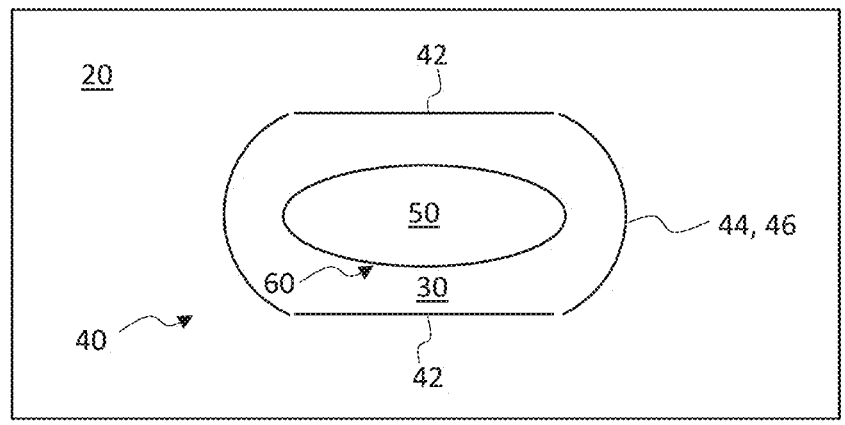

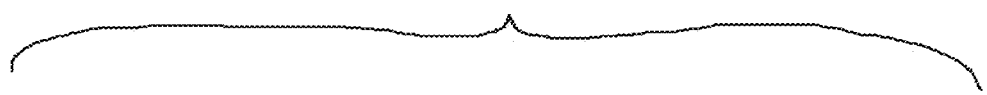
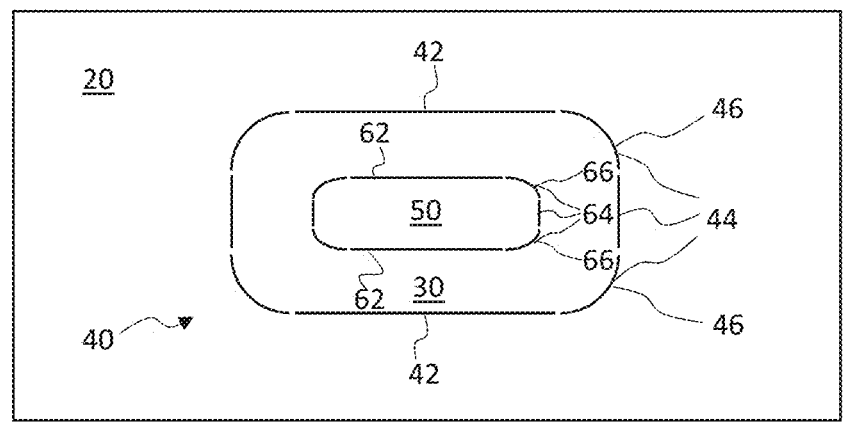
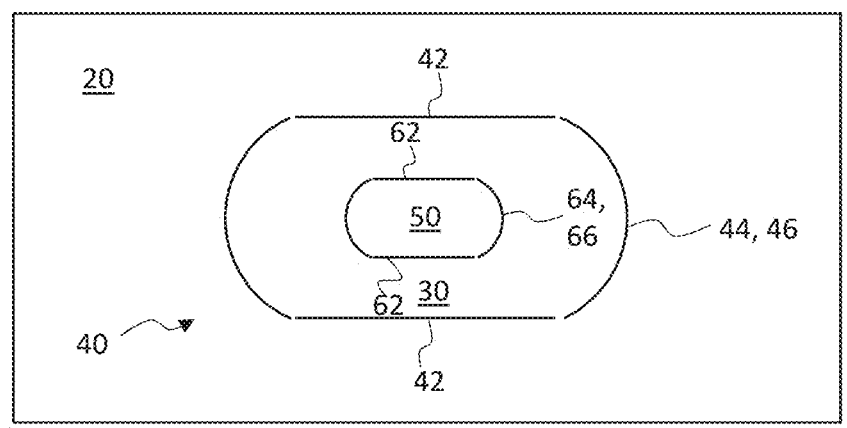

FIG. 28
(a)
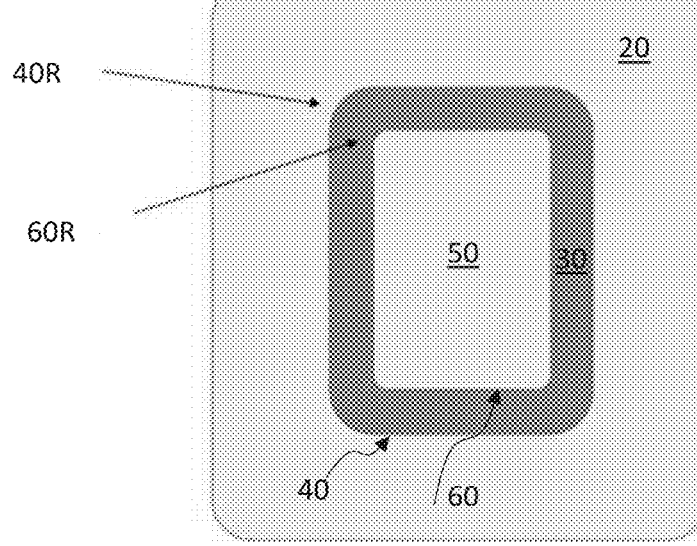
(b)
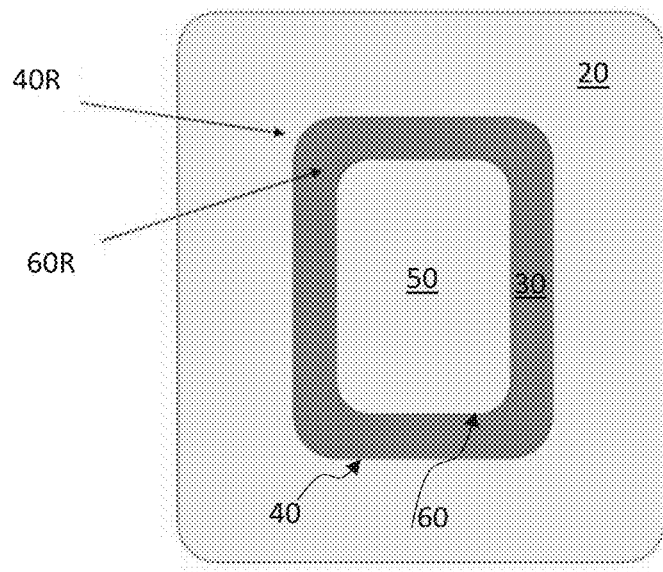

COMPOSITE ELEMENT

CROSS REFERENCE TO RELATED APPLICATIONS

This is a continuation of PCT application no. PCT/EP2021/073387, entitled "COMPOSITE ELEMENT", filed Aug. 24, 2021, which is incorporated herein by reference. PCT application no. PCT/EP2021/073387 claims priority to European patent application no. EP 20192446.1, filed Aug. 24, 2020, which is incorporated herein by reference.

BACKGROUND OF THE INVENTION

1. Field of the Invention

The present invention relates to a composite element having an outer holder, in particular including metal, and an inner component, in particular including glass, which is held in the outer holder under compressive stress.

2. Description of the Related Art

Composite elements having an outer metal holder and an inner glass component, which are also referred to as glass-to-metal seals (GTMS), come into consideration in numerous applications, for example for hermetic housing parts with a window.

In principle, glass-metal composite elements can be divided into two categories: on the one hand, elements in which the thermal expansion behavior of the metal housing and of the glass component are matched to one another, so-called matched glass-to-metal seals; and on the other hand, elements in which the metal housing exerts a compressive pressure on the glass component, so-called compression glass-to-metal seals. Matched glass-to-metal seals are suitable in particular for applications in which a uniform expansion or contraction behavior under fluctuating temperature conditions is important or in which as thin a metal housing as possible is required, so that sufficient compressive pressure cannot be generated. By contrast, if these factors are not paramount, compression glass-to-metal seals are generally used. Compression glass-to-metal seals typically have high corrosion resistance and pressure tolerance.

In compression glass-to-metal seals, the inner glass body is held in the outer metal holder under pressure, for example in that the outer metal holder is shrunk onto the glass body. This has the result that the metal housing firmly surrounds the inner glass, and a hermetic seal can be formed.

Hitherto, compression glass-to-metal seals typically include a circular glass body, which in turn is held in a circular cutout in the outer metal holder. A uniform, concentric pressure is thus generated on the inner glass component, whereby stresses or damage in the glass are avoided.

On the other hand, non-circular geometries of the glass body would be desirable for some applications. This concerns, for example, housing parts with a window, in which as large a window as possible is desirable but the component size is limited, such as in the case of smartwatches, for example. However, compression glass-to-metal seals with non-circular geometries present a challenge in a number of ways, in particular in relation to stresses in the glass component, deformation of the metal component, and also the stability and tightness of the contact surface between the glass and the metal.

Therefore, what is needed in the art are composite elements having an outer holder, in particular including metal, and an inner component, in particular including glass, which is held under compressive stress, wherein non-circular geometries are possible, in which stresses in the glass component and/or deformation of the metal component are kept as low as possible and/or the stability and tightness of the contact surface between the glass and the metal are as high as possible.

SUMMARY OF THE INVENTION

The present invention relates to a composite element having an outer holder and an inner component which is held in the outer holder, in particular under compressive stress, wherein the outer holder and the inner component adjoin one another along a closed contour line, wherein the contour line is non-circular and is curved at least in some portions, in particular is oval or elliptical.

In an optional embodiment, the present invention relates to a composite element having an outer holder and an inner component which is held in the outer holder under compressive stress.

In an optional embodiment, the outer holder and the inner component adjoin one another along a closed contour line, wherein the contour line includes two opposing linear portions extending in a straight line and two connecting portions which connect the two linear portions to form a closed contour line, wherein at least one of the two connecting portions has an arcuately extending curved region.

The outer holder optionally includes or consists of a material, in particular a metal, which has a first coefficient of thermal expansion, and the inner component optionally includes or consists of a material, in particular a glass, which has a second coefficient of thermal expansion, wherein the first coefficient of thermal expansion of the material of the outer holder is optionally greater than the second coefficient of thermal expansion of the material of the inner component.

At least one of the two connecting portions can have a first arcuately extending curved region, which directly adjoins one of the two linear portions, and a second arcuately extending curved region, which directly adjoins the other of the two linear portions.

The other of the two connecting portions optionally has the same form, such that the contour line has four rounded corners, in particular is rectangular with rounded corners.

It can be provided that the length of an arcuately extending curved region is at least 5% of the length of the connecting portion (44), optionally at least 10% of the length of the connecting portion (44), optionally at least 15% of the length of the connecting portion (44), optionally at least 20% of the length of the connecting portion (44), optionally at least 25% of the length of the connecting portion (44).

Furthermore, at least one of the two connecting portions can be in the form of a continuously arcuately extending curved region, in particular such that the two linear portions are connected without an intermediate region extending in a straight line.

The other of the two connecting portions optionally has the same form, such that the contour line has two sides which are continuously rounded, in particular is pill-shaped.

It is optionally provided that the smallest possible enveloping rectangle which surrounds the contour line includes a first side length, which optionally extends parallel to at least one of the two opposing linear portions, and includes a second side length extending orthogonal to the first side length.

In this case, the first side length can optionally be greater than the second side length, in particular by a factor of at least 1.1 and not more than 10, or of at least 1.1 and not more than 6, or of at least 1.1 and not more than 5, or of at least 1.1 and not more than 4, or of at least 1.1 and not more than 3, or of at least 1.2 and not more than 5, or of at least 1.2 and not more than 4, or of at least 1.3 and not more than 5, or of at least 1.3 and not more than 4, or of at least 1.4 and not more than 5, or of at least 1.4 and not more than 4, or of at least 1.5 and not more than 5, or of at least 1.5 and not more than 4, or of at least 1.6 and not more than 5, or of at least 1.6 and not more than 4, or of at least 1.7 and not more than 5, or of at least 1.7 and not more than 4, or of at least 1.8 and not more than 5, or of at least 1.8 and not more than 4, or of at least 1.9 and not more than 5, or of at least 1.9 and not more than 4, or of at least 2 and not more than 5, or of at least 2 and not more than 4, or of at least 2.5 and not more than 5, or of at least 2.5 and not more than 4, or of at least 3 and not more than 5, or of at least 3 and not more than 4.

It is optionally provided that the arcuately extending curved region of the connecting portion merges into the linear portion smoothly, optionally without a kink, optionally without a sudden bend. It can further be provided that the contour line extends smoothly, optionally extends without a kink, optionally extends without a sudden bend, at all points.

Optionally, it can further be provided that the contact pressure along the contour line is positive at all points, optionally is greater than 1 MPa, optionally greater than 2 MPa, optionally greater than 3 MPa, optionally greater than 4 MPa, optionally greater than 10 MPa, optionally greater than 20 MPa, optionally greater than 30 MPa, and/or that the contact pressure along the contour line is greater than 100 MPa, optionally greater than 200 MPa, optionally greater than 500 MPa, optionally greater than 1000 MPa, at at least one point.

Optionally, it can further be provided that the stress on the outer holder along the contour line is less than 300 MPa, optionally less than 250 MPa, optionally less than 240 MPa, optionally less than 230 MPa, optionally less than 225 MPa, optionally less than 220 MPa, optionally less than 215 MPa, optionally less than 210 MPa.

Optionally, it can further be provided that the stress on the inner component along the contour line is less than 300 MPa, optionally less than 200 MPa, optionally less than 100 MPa, optionally less than 150 MPa, optionally less than 95 MPa, optionally less than 90 MPa, optionally less than 85 MPa, optionally less than 80 MPa.

Optionally, it can further be provided that the deformation of the outer holder is less than 0.03 mm/mm, optionally less than 0.029 mm/mm, optionally less than 0.028 mm/mm, optionally less than 0.027 mm/mm.

The composite element is optionally used as a closure element of a housing, in particular in the back of an electronic device which can be worn on the body, for example of a heart rate monitor, smartwatch, fitness tracker, etc. Such elements are also called back covers, and these are likewise included in the present invention. The windows are here required in particular for measuring the heart rate, in which optical transmitters and sensors are able to measure the wearer's heart rate. Therefore, in most cases in order to permit optical signal separation, the back cover of such an electronic device advantageously has more than one window.

The inventors have recognized that, by way of the present invention, it is possible to arrange the windows closer together than was anticipated, without unduly reducing the compressive stress on the windows. This is particularly advantageous for electronic devices which can be worn on the body, because it is thus possible to provide more windows in a given area and/or more window area per back cover.

In a development, the composite element can include an outer holder, an inner component and further an electrical conductor which extends through the inner component, wherein the outer holder and the inner component adjoin one another along a closed contour line, and wherein, furthermore, the inner component and the electrical conductor adjoin one another along a closed second contour line.

For example, there can be provided an electrical conductor which extends through an electrically insulating inner component and can serve, for example, as an electrode.

The outer holder can include or consist of a material, in particular a metal, which has a first coefficient of thermal expansion, the inner component can include or consist of a material, in particular a glass, which has a second coefficient of thermal expansion, and the electrical conductor can include or consist of a material, in particular a metal, which has a third coefficient of thermal expansion.

It can be provided that the third coefficient of thermal expansion differs from the second coefficient of thermal expansion by less than a factor of 3, optionally by less than a factor of 2, optionally by less than a factor of 1.5, optionally by less than a factor of 1.25.

It can be provided that the third coefficient of thermal expansion differs from the first coefficient of thermal expansion by less than a factor of 3, optionally by less than a factor of 2, optionally by less than a factor of 1.5, optionally by less than a factor of 1.25.

Referring to FIG. 28, the contour line along which the outer holder and the inner component adjoin one another can define a smallest possible first enveloping rectangle, which surrounds the contour line, and the second contour line along which the inner component and the electrical conductor adjoin one another can define a smallest possible second enveloping rectangle, which surrounds the second contour line, wherein both the first enveloping rectangle and the second enveloping rectangle each have a longer and a shorter side length, and wherein the longer side lengths of the two enveloping rectangles extend parallel to one another or extend at an angle to one another which is smaller than 20 degrees, optionally smaller than 10 degrees, optionally smaller than 5 degrees.

The longer side length of the first enveloping rectangle can be greater than the shorter side length of the first enveloping rectangle by a first factor, and the longer side length of the second enveloping rectangle can be greater than the shorter side length of the second enveloping rectangle by a second factor, and the second factor can differ from the first factor by less than 400%, optionally by less than 200%, optionally by less than 100%, or by less than 50%, by less than 25%, or by less than 20%, or by less than 15%, or by less than 10%, or by less than 5%.

The second contour line along which the inner component and the electrical conductor adjoin one another can include two opposing linear portions extending in a straight line and two connecting portions which connect the two linear portions to form a closed contour line, wherein at least one of the two connecting portions can have an arcuately extending curved region.

In respect of the second contour line along which the inner component and the electrical conductor adjoin one another, at least one of the two connecting portions can have a first arcuately extending curved region, which directly adjoins one of the two linear portions, and a second arcuately extending curved region, which directly adjoins the other of the two linear portions, wherein the other of the two connecting portions optionally has the same form, such that the second contour line has four rounded corners, in particular is rectangular with rounded corners.

In respect of the second contour line along which the inner component and the electrical conductor adjoin one another, the length of an arcuately extending curved region can be at least 5% of the length of the connecting portion, optionally at least 10% of the length of the connecting portion, optionally at least 15% of the length of the connecting portion, optionally at least 20% of the length of the connecting portion, optionally at least 25% of the length of the connecting portion.

In respect of the second contour line along which the inner component and the electrical conductor adjoin one another, at least one of the two connecting portions can be in the form of a continuously arcuately extending curved region, in particular such that the two linear portions are connected without an intermediate region extending in a straight line, wherein the other of the two connecting portions optionally has the same form, such that the second contour line has two sides which are continuously rounded, in particular is pill-shaped.

The smallest possible enveloping rectangle which surrounds the second contour line can include a first side length, which optionally extends parallel to at least one of the two opposing linear portions, and can further include a second side length extending orthogonal to the first side length, wherein the first side length is optionally greater than the second side length, in particular by a factor of at least 1.1 and not more than 10, or of at least 1.1 and not more than 6, or of at least 1.1 and not more than 5, or of at least 1.1 and not more than 4, or of at least 1.1 and not more than 3, or of at least 1.2 and not more than 5, or of at least 1.2 and not more than 4, or of at least 1.3 and not more than 5, or of at least 1.3 and not more than 4, or of at least 1.4 and not more than 5, or of at least 1.4 and not more than 4, or of at least 1.5 and not more than 5, or of at least 1.5 and not more than 4, or of at least 1.6 and not more than 5, or of at least 1.6 and not more than 4, or of at least 1.7 and not more than 5, or of at least 1.7 and not more than 4, or of at least 1.8 and not more than 5, or of at least 1.8 and not more than 4, or of at least 1.9 and not more than 5, or of at least 1.9 and not more than 4, or of at least 2 and not more than 5, or of at least 2 and not more than 4, or of at least 2.5 and not more than 5, or of at least 2.5 and not more than 4, or of at least 3 and not more than 5, or of at least 3 and not more than 4.

It can be provided that, in respect of the second contour line along which the inner component and the electrical conductor adjoin one another, the arcuately extending curved region of the connecting portion merges into the linear portion smoothly, optionally without a kink, optionally without a sudden bend, and/or that the second contour line extends smoothly, optionally extends without a kink, optionally extends without a sudden bend, at all points.

According to one embodiment, the contour line along which the outer holder and the inner component adjoin one another, in particular at least one of the connecting portions, in particular at least one of the curved regions, can define a first curved portion, and the second contour line along which the inner component and the electrical conductor adjoin one another, in particular at least one of the connecting portions, in particular at least one of the curved regions, can define a second curved portion, which in particular lies directly opposite the first curved portion, wherein the distance between the contour line and the second contour line is greater in the region of the first and second curved portions than in the region of a portion that is less curved or not curved, in particular greater than in the region of a linear portion.

According to one embodiment, the contour line along which the outer holder and the inner component adjoin one another, in particular at least one of the connecting portions, in particular at least one of the curved regions, can define a first radius, and the second contour line along which the inner component and the electrical conductor adjoin one another, in particular at least one of the connecting portions, in particular at least one of the curved regions, can define a second radius, which in particular lies directly opposite the first radius, wherein the ratio between the first radius and the second radius is less than 10, optionally less than 5, optionally less than 3, optionally less than 2, or less than 1.5, or less than 1.25, or less than 1, in particular such that the distance between the contour line and the second contour line is greater in the region of the first and second radii than in the region of the linear portions.

According to one embodiment, the contour line along which the outer holder and the inner component adjoin one another and the second contour line along which the inner component and the electrical conductor adjoin one another can be at a constant distance from one another along the entirety of the contour lines, except at curved regions of the contour lines, wherein at curved regions of the contour lines the distance between the contour lines is greater.

The composite element can have a first side and a second side, such that the electrical conductor extends through the inner component from the first side of the composite element to the second side of the composite element.

The contour line along which the outer holder and the inner component adjoin one another can optionally be identical on both sides of the composite element. The contour line along which the inner component and the electrical conductor adjoin one another can optionally also be identical on both sides of the composite element.

The electrical conductor can terminate flush with the inner component on one or both sides of the composite element or can have an offset relative thereto which is smaller than 500 m, optionally smaller than 150 m, optionally smaller than 100 m.

On the other hand, the electrical conductor can protrude from the inner component on one or both sides of the composite element with an overhang, wherein the overhang is in particular greater than 500 m, in particular in order to permit electrical contacting.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above-mentioned and other features and advantages of this invention, and the manner of attaining them, will become more apparent and the invention will be better understood by reference to the following description of embodiments of the invention taken in conjunction with the accompanying drawings, wherein:

FIG.

FIGS. 5-12 each show a glass-metal composite element, wherein the inner component including glass has a rectangular geometry with different side ratios (from 1:1.2 in FIG. 5 to 1:4 in FIG. 12) and with rounded corners (a) and (b), depicted as in FIG. 1, and representations (c) to (i) corresponding to FIG. 1;

FIG. 23 shows, in an enlarged representation, two composite elements, wherein the contour line at which the inner component 30 and the outer holder 20 adjoin one another includes two opposing linear portions 42 extending in a straight line and two connecting portions 44 which connect the two linear portions 42 to form a closed contour line, wherein the connecting portions 44 each have two arcuately extending curved regions separated from one another by a linear portion (a) or have a continuously arcuately extending curved region (b);

FIG. 24 shows, in a sectional side view, glass-metal composite elements having an electrical conductor 50 extending through the inner component 30, wherein the electrical conductor 50 adjoins the inner component 30 at a second contour line 60, wherein the electrical conductor can terminate flush with the inner component on one side or on both sides (a) or can protrude from the inner component on one side or on both sides (b);

FIG. 25 shows, in a top view, glass-metal composite elements having an electrical conductor 50 extending through the inner component 30, wherein the contour line at which the inner component 30 and the outer holder 20 adjoin one another is configured with a rectangular geometry with rounded corners (a) or with a pill-shaped geometry (b), and the electrical conductor 50 has a round shape and thus defines a round contour line 60 along which the electrical conductor 50 adjoins the inner component 30;

FIG. 26 shows, in a top view, similar to FIG. 25, glass-metal composite elements having an electrical conductor 50 extending through the inner component 30, wherein the second contour line 60 along which the electrical conductor 50 adjoins the inner component 30 has an elongate, here oval, shape, wherein the principal axes of the second contour line 60 coincide with the principal axes of the contour line 40, that is to say the longitudinal extent runs in the same direction;

FIG. 27 shows, in a top view, similar to FIG. 25, glass-metal composite elements having an electrical conductor 50 extending through the inner component 30, wherein the second contour line 60 along which the electrical conductor 50 adjoins the inner component 30 includes two opposing linear portions 62 extending in a straight line and two connecting portions 64 which connect the two linear portions 62 to form a closed contour line, such that the second contour line 60 in particular has the same features as the contour line 40;

FIG. 28 shows, in a top view, glass-metal composite elements having an electrical conductor 50, wherein both the contour line 40 and the second contour line 60 have a rectangular geometry with rounded corners, wherein the distance of the contour lines 40, 60 from one another is constant along the entirety of the contour lines (a) or is constant along the entirety of the contour lines except in the region of the rounded corners, at which the distance is greater (b);

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 1:
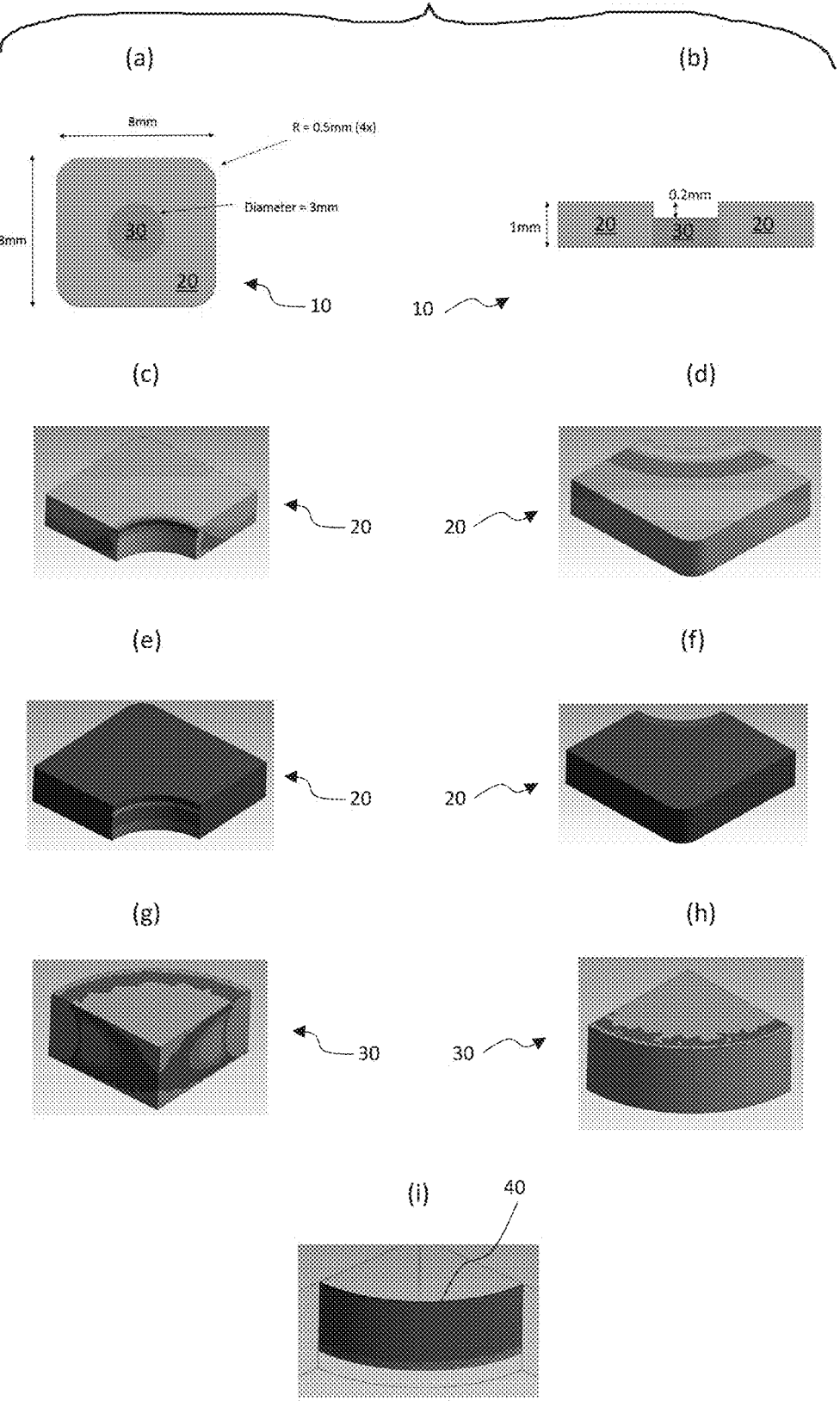
FIG. 1 shows a glass-metal composite element 10, wherein the inner component including glass has a circular geometry, depicted in a top view (a) and in a sectional view (b), and also two partial representations of the stress on the outer holder including metal (c) and (d), two partial representations of the deformation of the outer holder including metal (e) and (f), two partial representations of the load on the inner component including glass (g) and (h), and a partial representation of the contact pressure (i)

In addition to the representations, generated by computer simulation, shown in FIGS. 1 to 22, the following tables contain further data, in particular the stress on the outer holder including metal in MPa (Stress on Metal), the deformation of the outer holder including metal in mm/mm (Deformation on Metal), the stress on the inner component including glass in MPa (Stress on Glass), and the maximum and minimum contact pressure in MPa (Contact Pressure Max, Contact Pressure Min).

| FIG. | 1 | 2 | 3 | 4 | 5 |
|---|---|---|---|---|---|
| Geometry | Circle | Square | Square | Rectangle | Rectangle |
| Aspect Ratio | 1:1 | 1:1 | 1:1 | 1:1.4 | 1:1.2 |
| Corner Radius (mm) | — | — | 0.1 | — | 0.1 |
| Stress on Metal (MPa) | 187.72 | 334.02 | 260.93 | 339.39 | 256.45 |
| Deformation on Metal (mm/mm) | 0.027521 | 0.035721 | 0.042859 | 0.031336 | 0.035033 |
| Stress on Glass (MPa) | 46.956 | 200.73 | 179.89 | 180.32 | 175.45 |
| Contact Pressure (MPa) Max | 1341.1 | 992.02 | 1022.7 | 1009.9 | 1199.9 |
| Contact Pressure (MPa) Min | 31.269 | −30.55 | −34.827 | −71.555 | −32.249 |

| FIG. | 6 | 7 | 8 | 9 | 10 |
|---|---|---|---|---|---|
| Geometry | Rectangle | Rectangle | Rectangle | Rectangle | Rectangle |
| Aspect Ratio | 1:1.4 | 1:1.5 | 1:1.6 | 1:1.8 | 1:2 |
| Corner Radius (mm) | 0.1 | 0.1 | 0.1 | 0.1 | 0.1 |
| Stress on Metal (MPa) | 260.59 | 258.72 | 255.24 | 254.16 | 253.57 |
| Deformation on Metal (mm/mm) | 0.083572 | 0.029809 | 0.032497 | 0.032806 | 0.029789 |
| Stress on Glass (MPa) | 289.98 | 159.94 | 154.55 | 158.849 | 145.35 |
| Contact Pressure (MPa) Max | 1592.1 | 1109.4 | 1012.2 | 1038.2 | 1128 |
| Contact Pressure (MPa) Min | −160.77 | −24.171 | −34.622 | −19.04 | −17.929 |

| FIG. | 11 | 12 | 13 | 14 | 15 |
|---|---|---|---|---|---|
| Geometry | Rectangle | Rectangle | Pill | Pill | Pill |
| Aspect Ratio | 1:3 | 1:4 | 1:1.4 | 1:1.2 | 1:1.5 |
| Corner Radius (mm) | 0.1 | 0.1 | — | — | — |
| Stress on Metal (MPa) | 250.8 | 246.38 | 206.18 | 201.05 | 208.51 |
| Deformation on Metal (mm/mm) | 0.027146 | 0.029554 | 0.027753 | 0.024531 | 0.026366 |
| Stress on Glass (MPa) | 133.45 | 137.86 | 69.197 | 53.916 | 58.715 |
| Contact Pressure (MPa) Max | 1135.2 | 1148.7 | 1132.8 | 1194.4 | 1329.1 |
| Contact Pressure (MPa) Min | −24.986 | −14.91 | 45.019 | 44.447 | 32.47 |

| FIG. | 16 | 17 | 18 | 19 | 20 | 21 | 22 |
|---|---|---|---|---|---|---|---|
| Geometry | Pill | Pill | Pill | Pill | Pill | Rectangle | Rectangle |
| Aspect Ratio | 1:1.8 | 1:2 | 1:3 | 1:4 | 1:1.6 | 1:1.6 | 1:1.6 |
| Corner Radius (mm) | — | — | — | — | — | 0.25 | 0.5 |
| Stress on Metal (MPa) | 212.81 | 215.33 | 220.1 | 221.49 | 209.49 | 230.38 | 221.88 |
| Deformation on Metal (mm/mm) | 0.026416 | 0.027522 | 0.027486 | 0.026695 | 0.02397 | 0.030287 | 0.027531 |
| Stress on Glass (MPa) | 76.135 | 83.509 | 86.538 | 94.843 | 79.8 | 126 | 84.143 |
| Contact Pressure (MPa) Max | 1160.7 | 1344.2 | 1122.4 | 1281.6 | 1354.2 | 1095.8 | 1212.7 |
| Contact Pressure (MPa) Min | 41.164 | 37.098 | 15.835 | 4.6214 | 28.323 | −13.41 | 19.292 |

Figure 2:
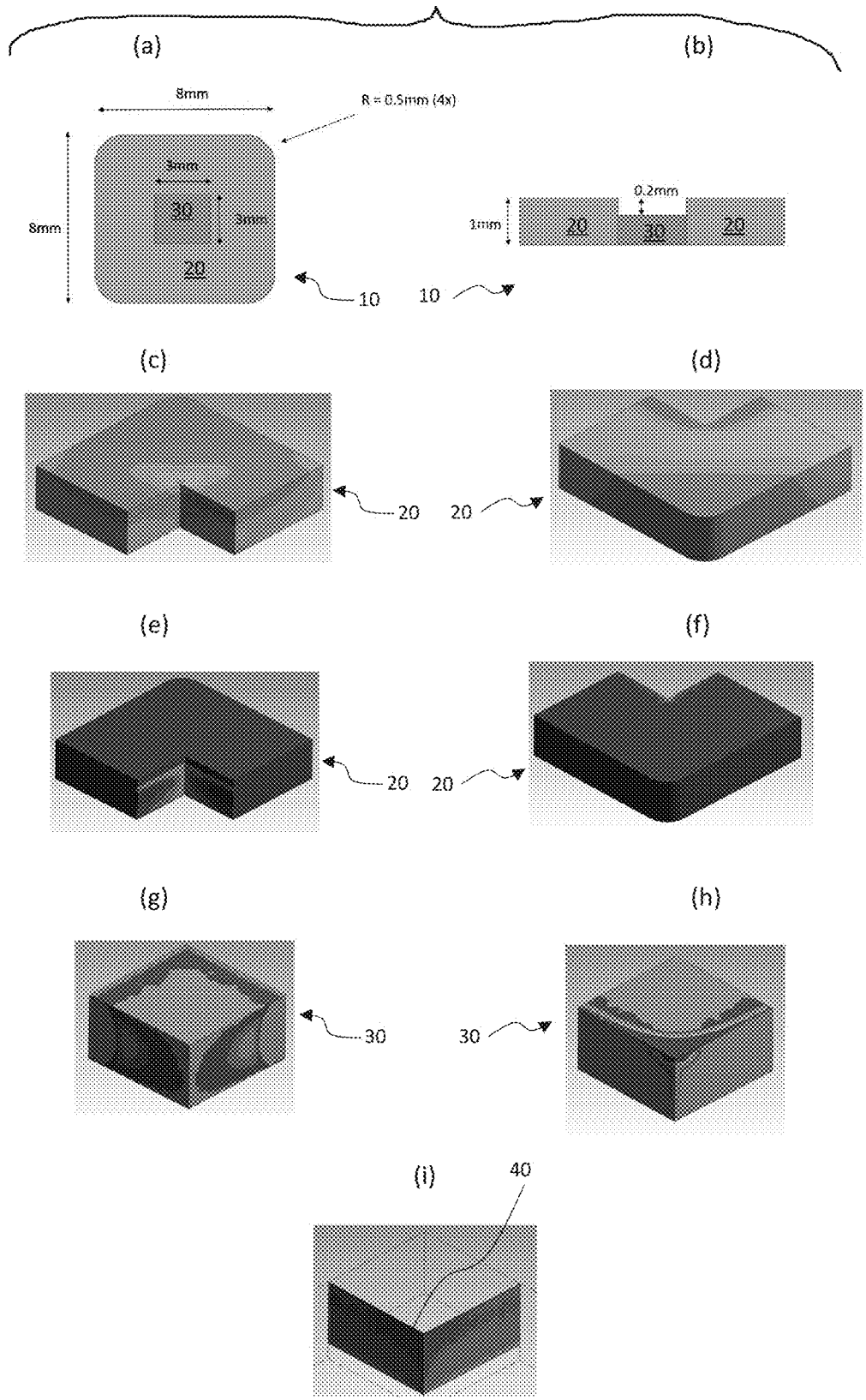
FIG. 2 shows a glass-metal composite element, wherein the inner component including glass has a square geometry (a) and (b), depicted as in FIG. 1, and representations (c) to (i) corresponding to FIG. 1.
Figure 4:
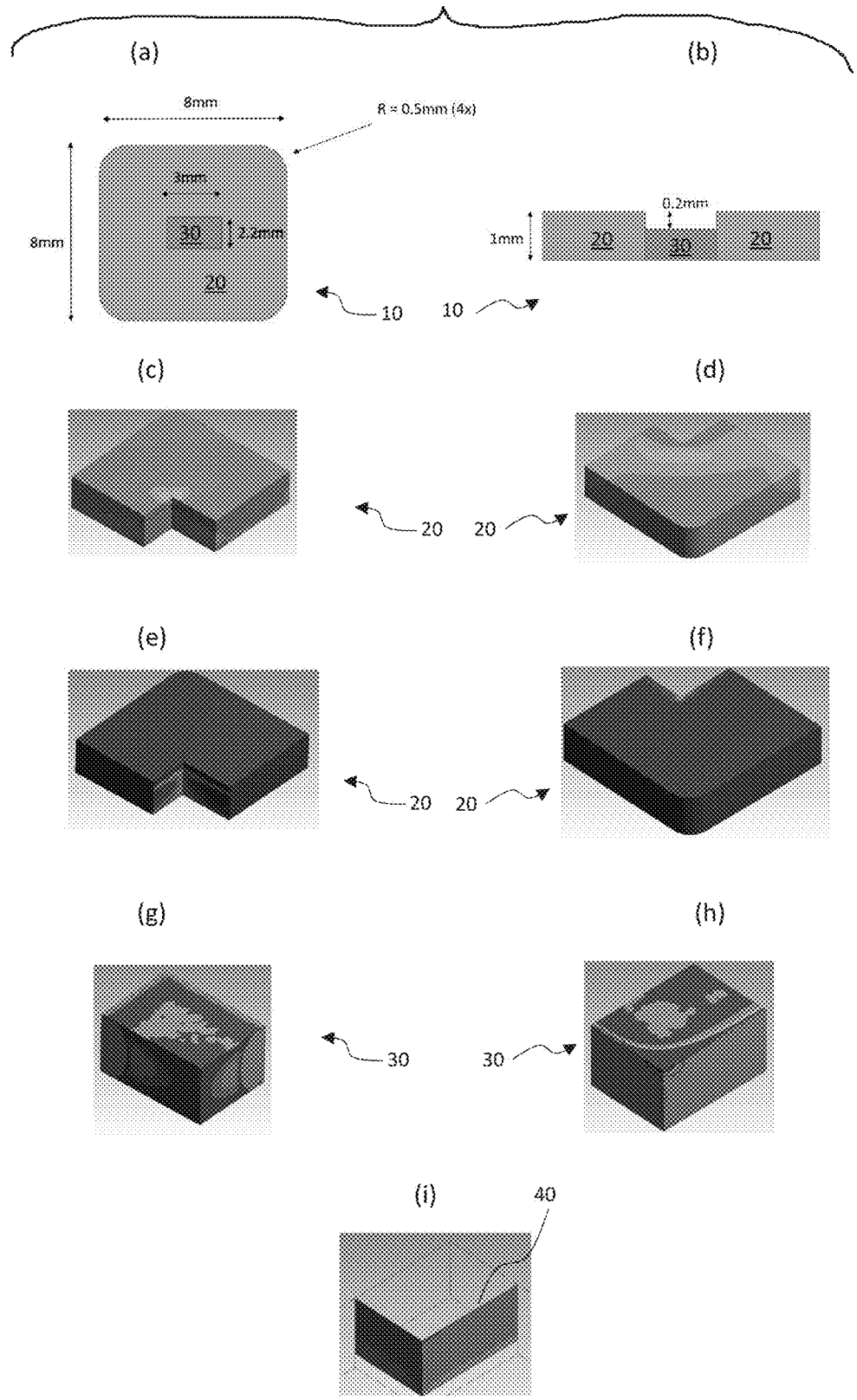
FIG. 4 shows a glass-metal composite element, wherein the inner component including glass has a rectangular geometry with a side ratio of 1:1.4 (a) and (b), depicted as in FIG. 1, and representations (c) to (i) corresponding to FIG. 1.
Figure 5:
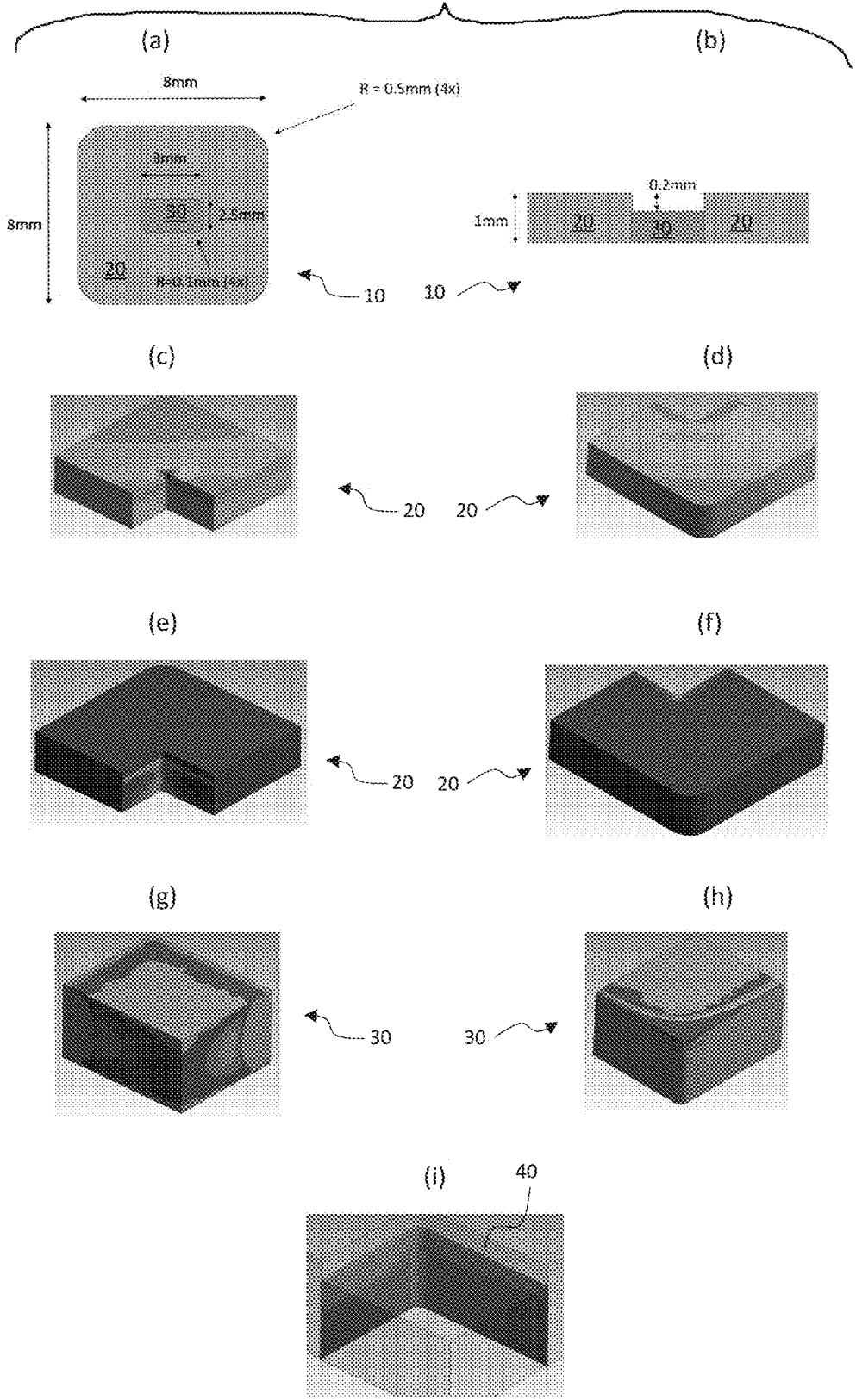
Figure 6:
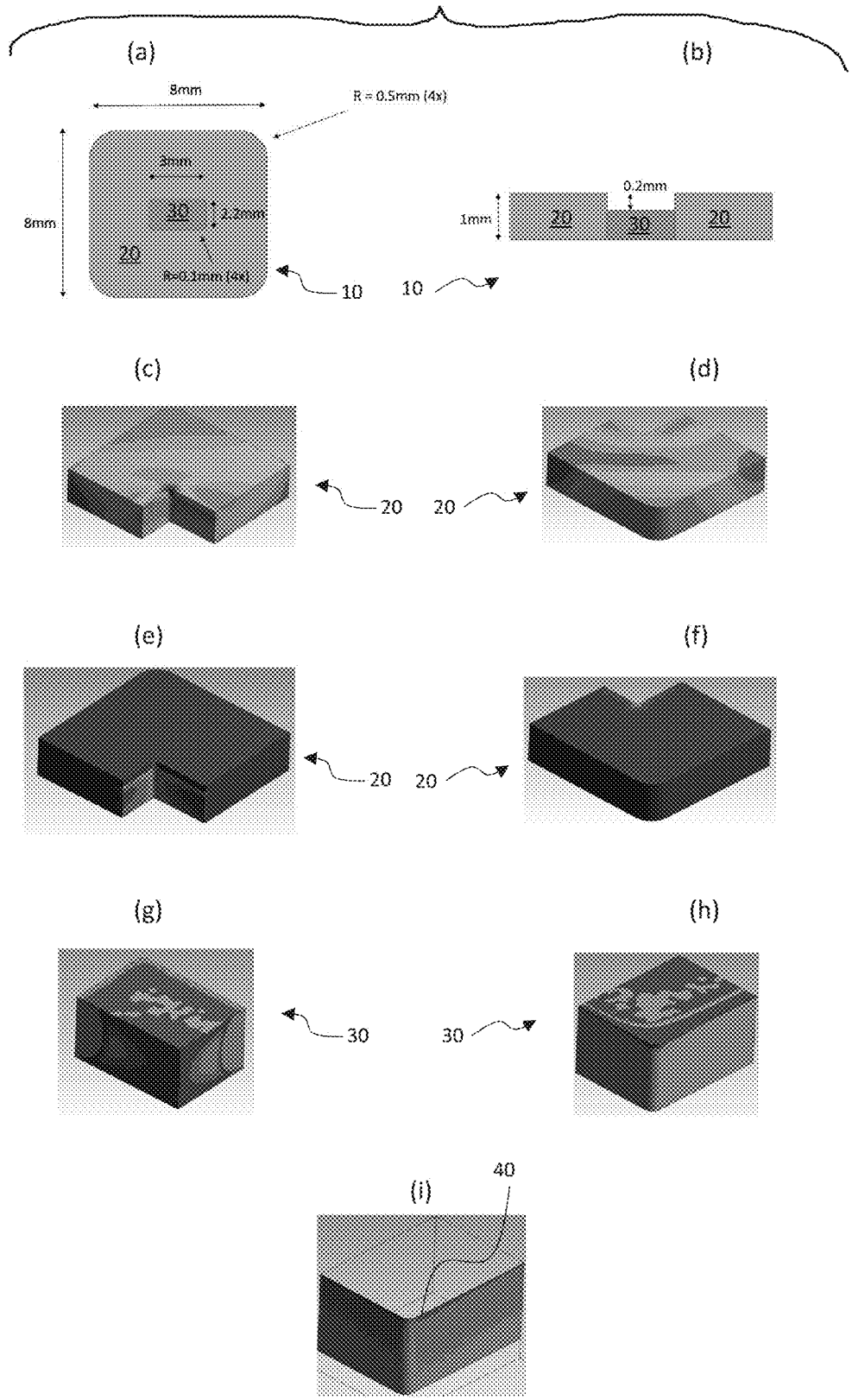

Generally, the following observations can be made:

The stresses in all the components and the metal deformation increase by several orders of magnitude from the circle to the square/rectangle (see FIGS. 1, 2, 4).

Figure 3:
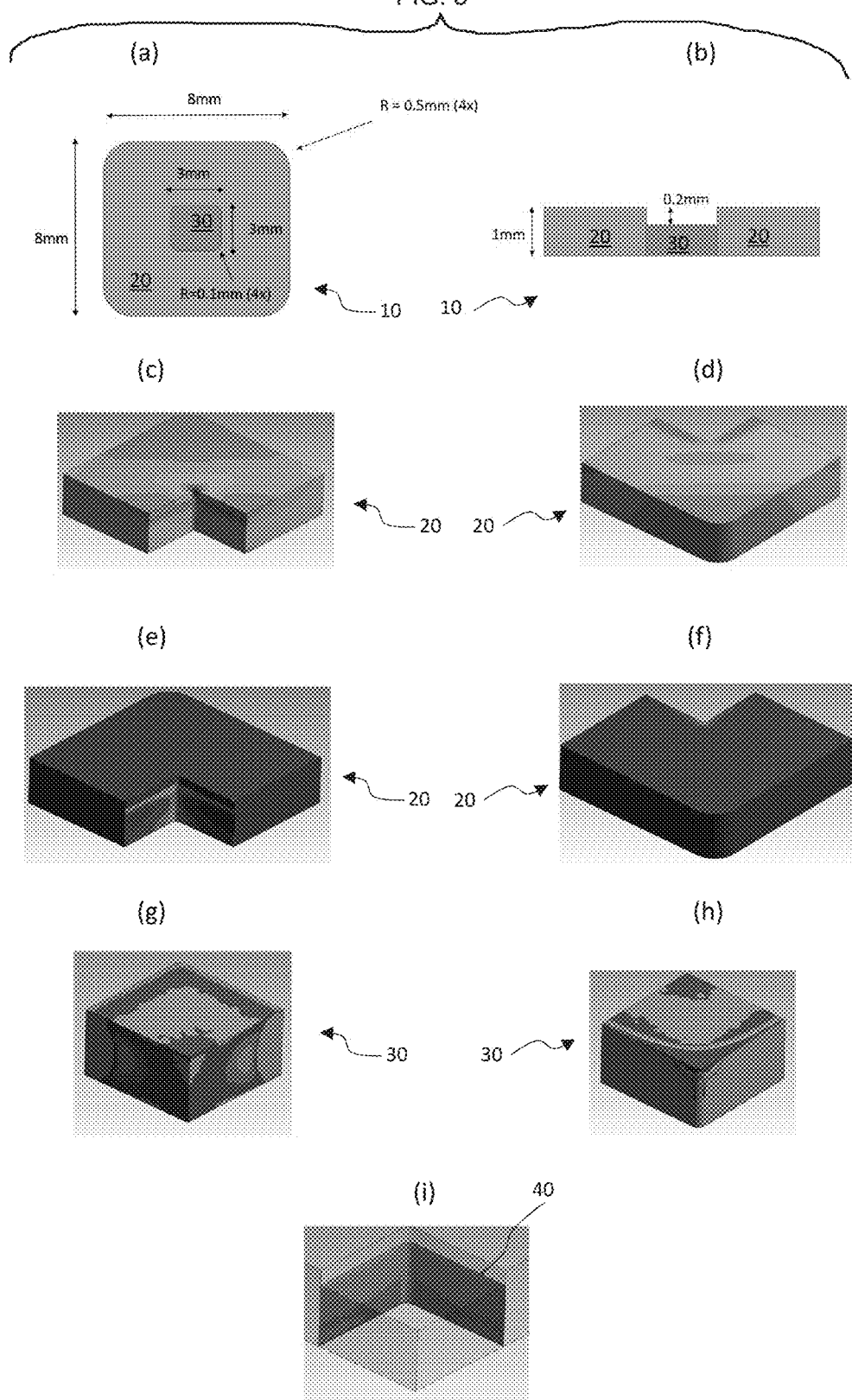
FIG. 3 shows a glass-metal composite element, wherein the inner component including glass has a square geometry with rounded corners (a) and (b), depicted as in FIG. 1, and representations (c) to (i) corresponding to FIG. 1.

Squares and rectangles with sharp edges have similarly high stresses (see FIGS. 2, 3, 4).

Figure 8:
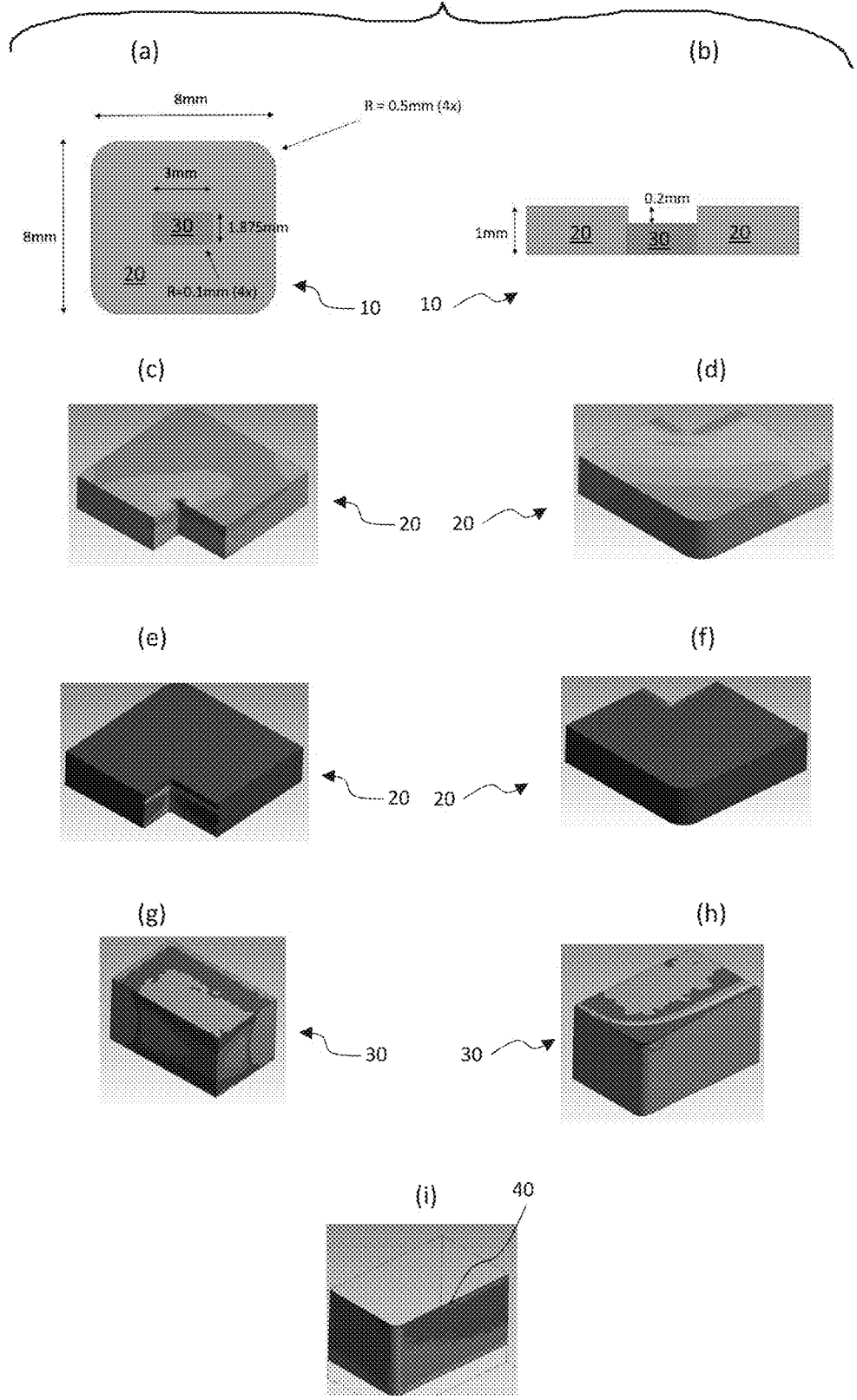
Figure 21:
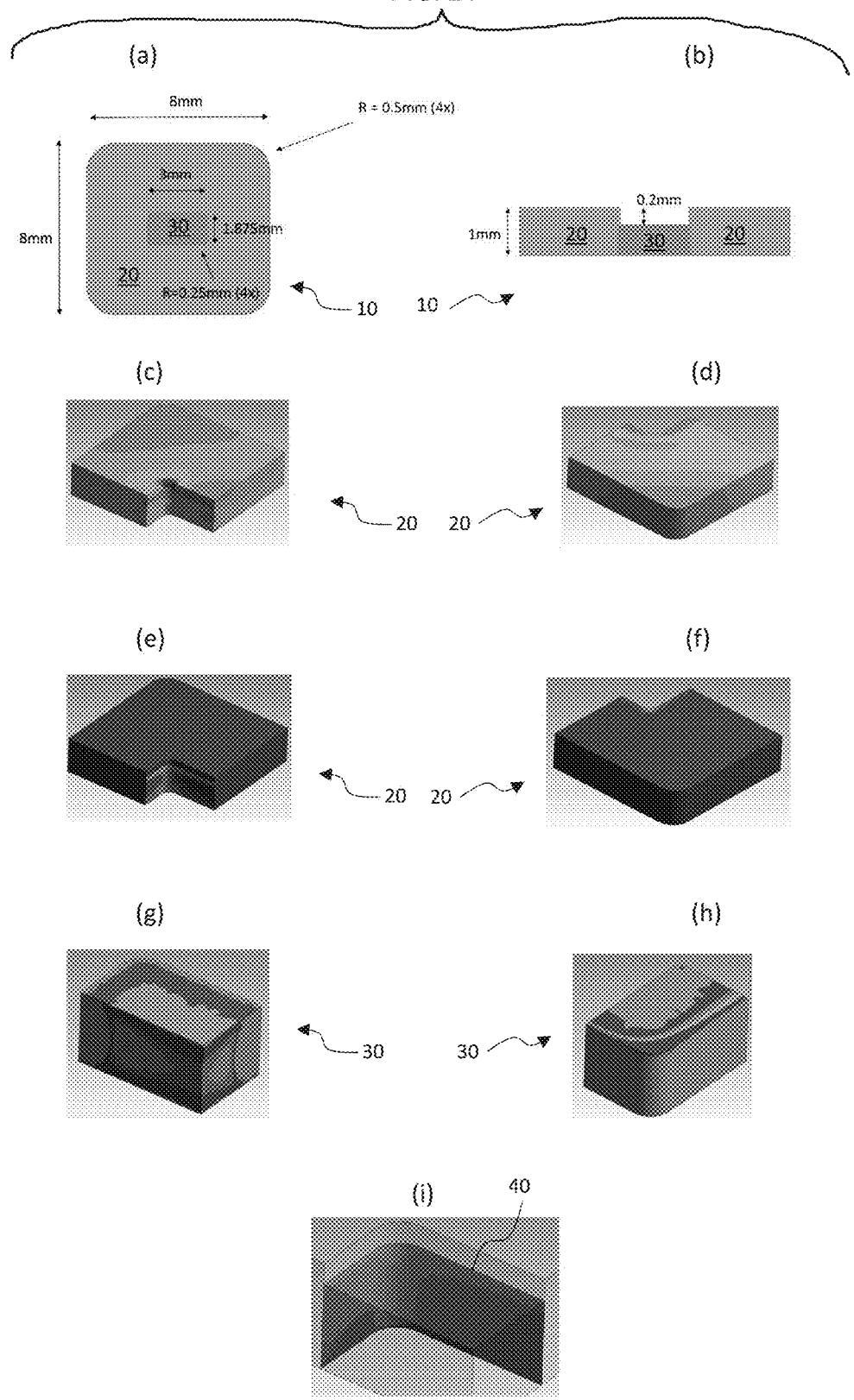
FIGS. 21, 22 each show a glass-metal composite element, wherein the inner component including glass has a rectangular geometry with a side ratio of 1:1.6 and with rounded corners with different corner radii (0.25 mm in FIGS. 21 and 0.5 mm in FIG. 22) (a) and (b), depicted as in FIG. 1, and representations (c) to (i) corresponding to FIG. 1.
Figure 22:
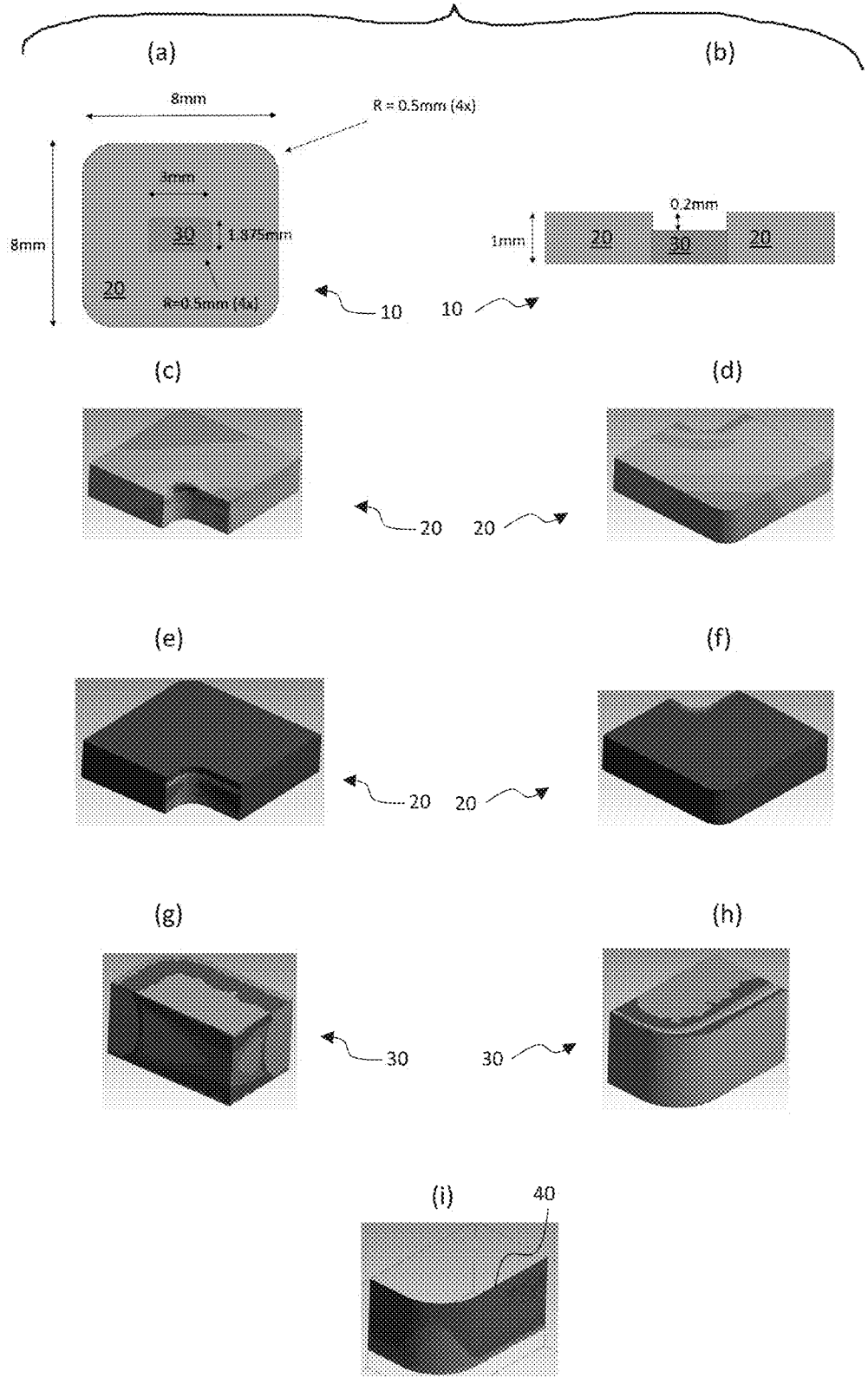
Figure 29:
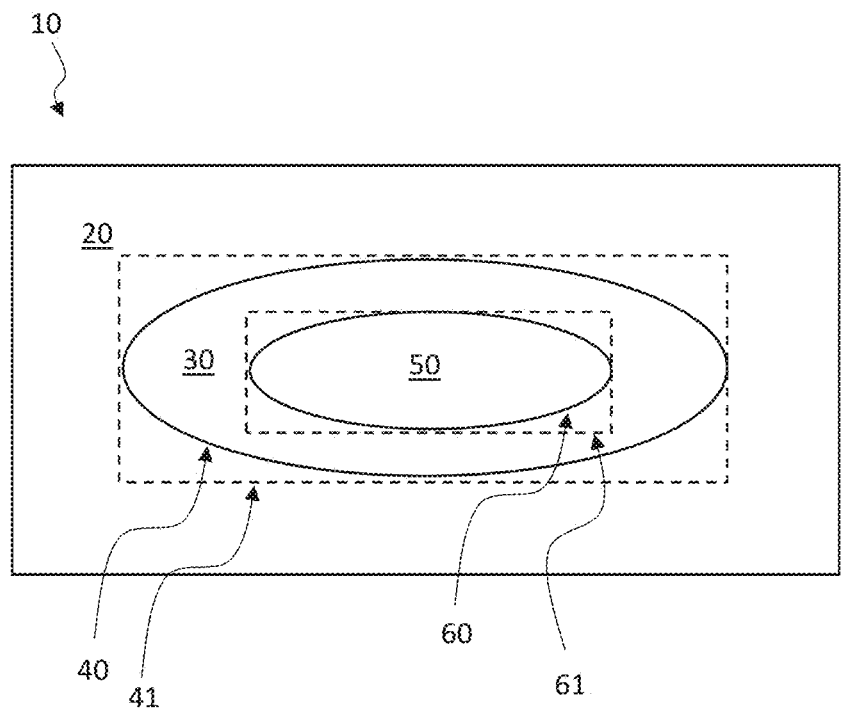
FIG. 29 shows, in a top view, a glass-metal composite element having an electrical conductor 50, wherein the contour line 40 defines a smallest possible first enveloping rectangle 41, and the second contour line 60 defines a smallest possible second enveloping rectangle 61, wherein the two enveloping rectangles are oriented relative to one another in such a manner that the longer sides of the enveloping rectangles (and also the shorter sides of the enveloping rectangles) extend parallel to one another, in other words in such a manner that the principal axes of the contour lines 40, 60, which here are elliptical in shape, run in the same direction.
Figure 30:
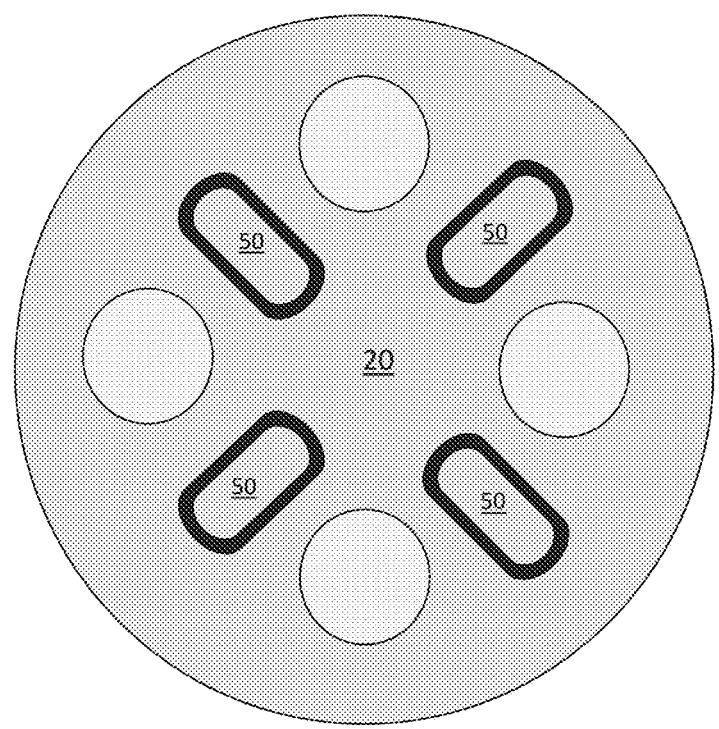
FIG. 30 shows a glass-metal composite element having an outer holder in which there are held a plurality of inner components through each of which an electrical conductor 50 extends, wherein the inner components function in particular as insulators for the electrical conductors serving, for example, as electrodes.

The transition from sharp corners to rounded corners leads to stress relief (see FIGS. 8, 21, 22).

The tensile stress on the glass surface increases in terms of area as the rectangular side ratio increases. Others remain relatively similar (see FIGS. 4-12).

Rectangular glasses with a corner radius have some regions with negative contact pressure, until a particular radius value is reached (see FIGS. 21, 22).

Figure 9:
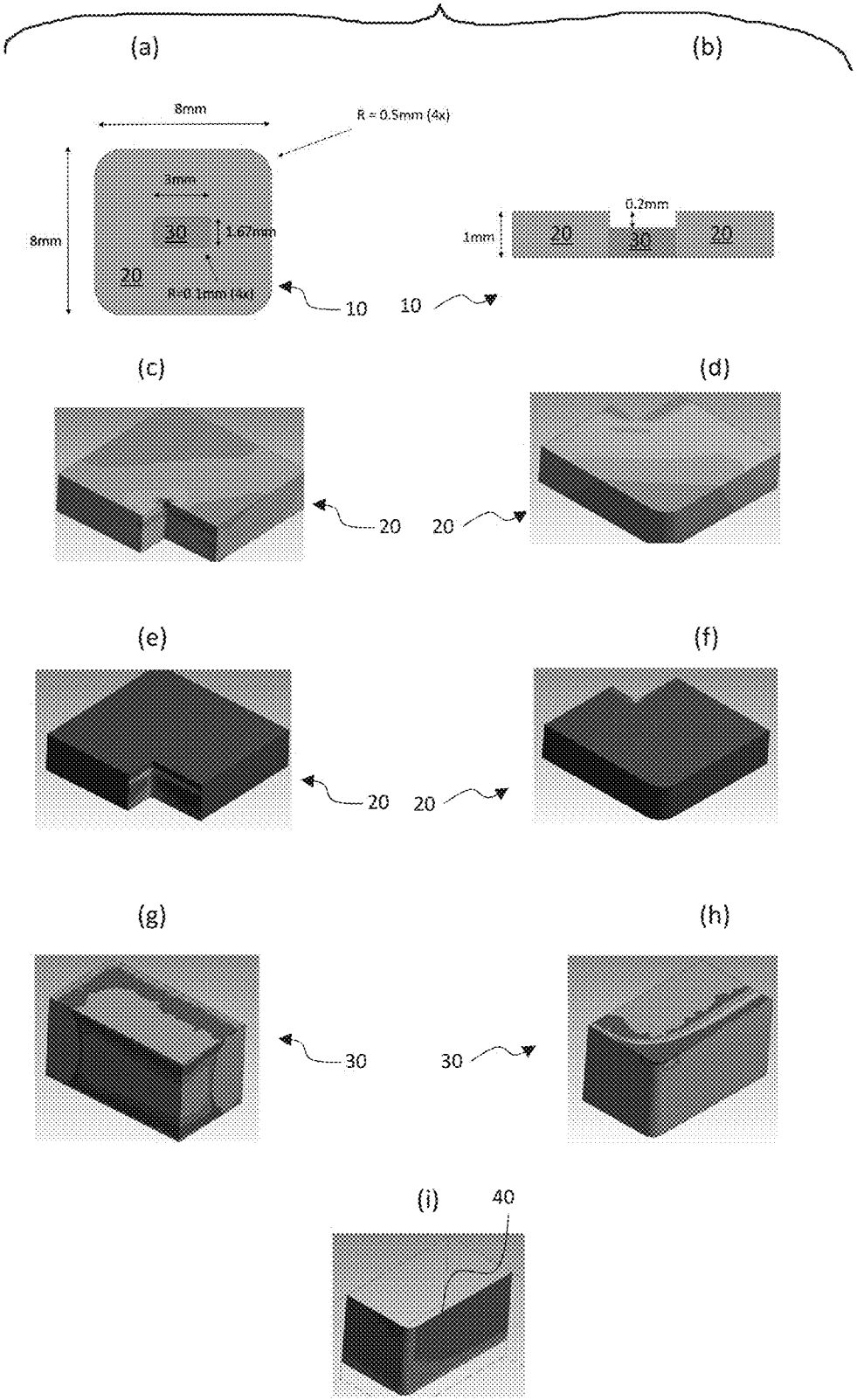
Figure 11:
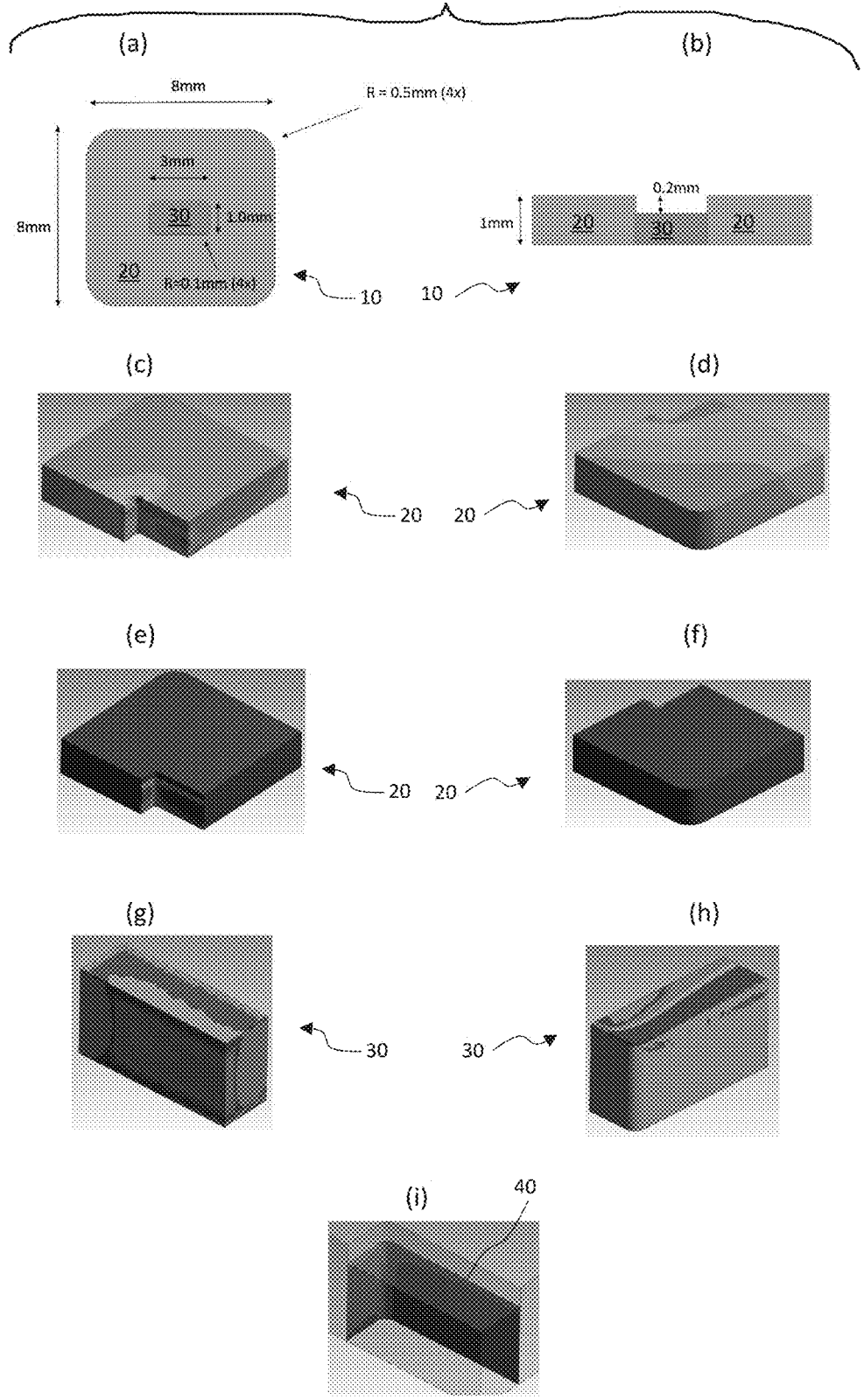
Figure 12:
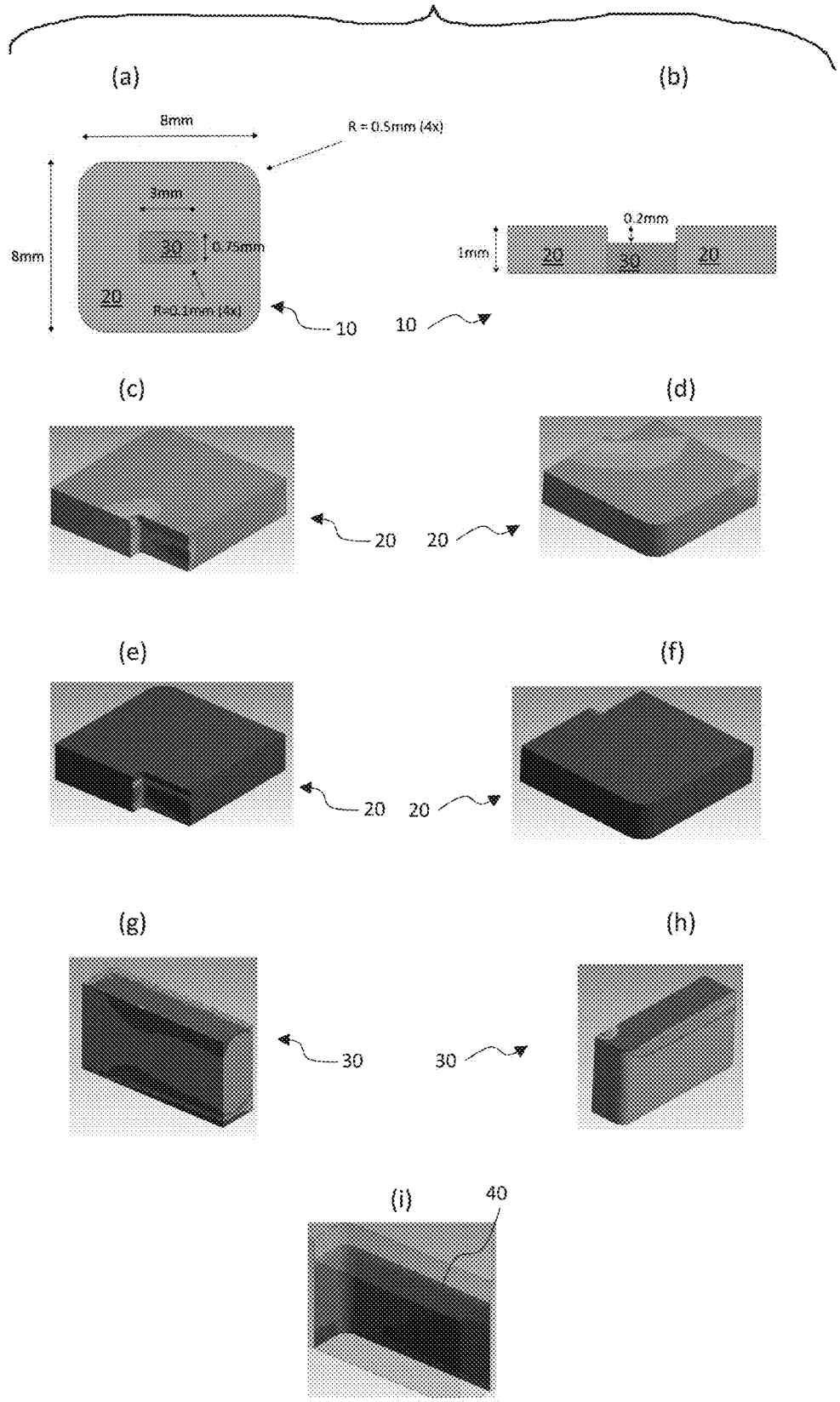
Figure 13:
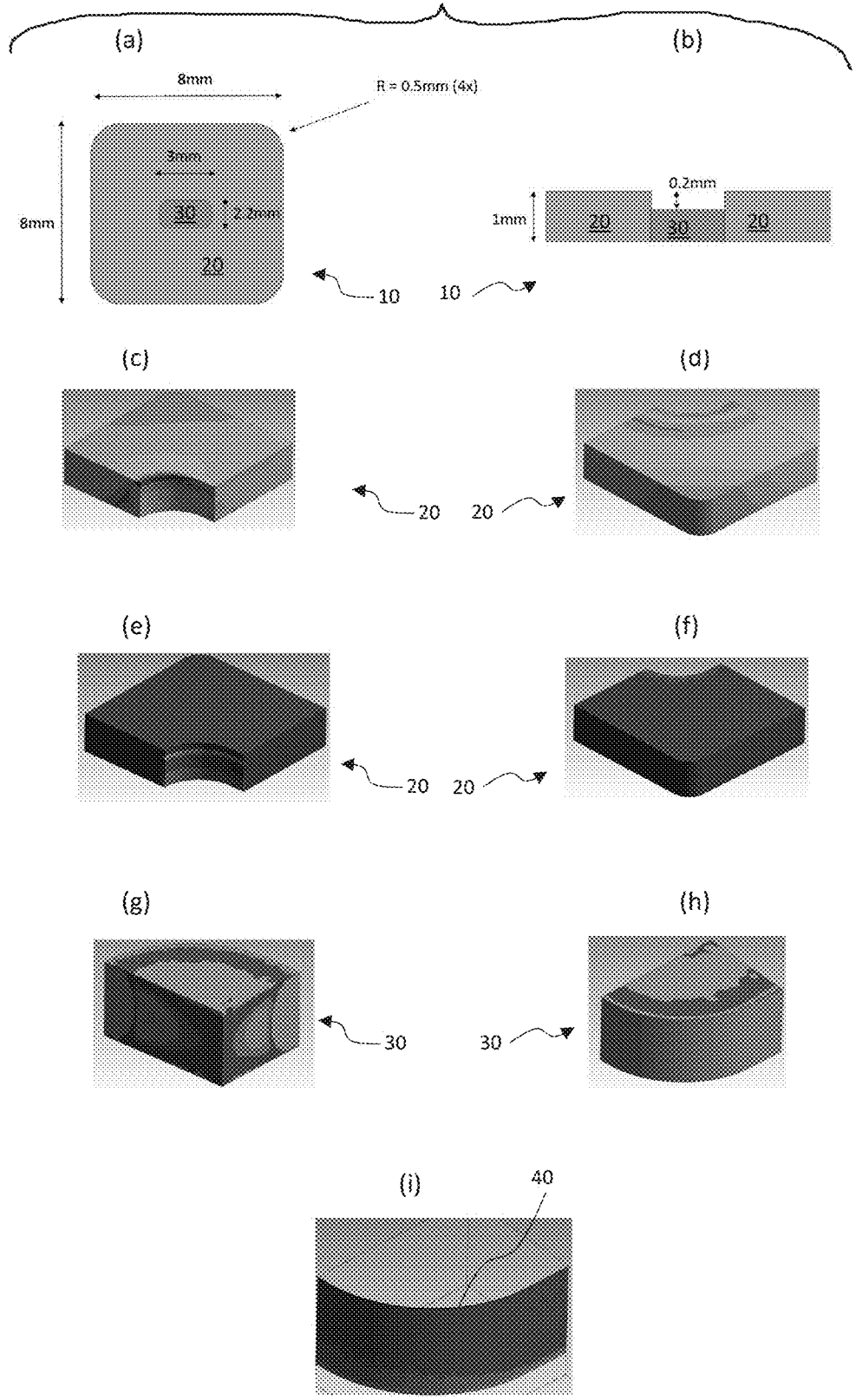
FIGS. 13-19 each show a glass-metal composite element, wherein the inner component including glass has a pill-shaped geometry with different side ratios (1:1.4 in FIG. 13, from 1:1.2 in FIG. 14 to 1:4 in FIG. 19) (a) and (b), depicted as in FIG. 1, and representations (c) to (i) corresponding to FIG. 1.
Figure 14:
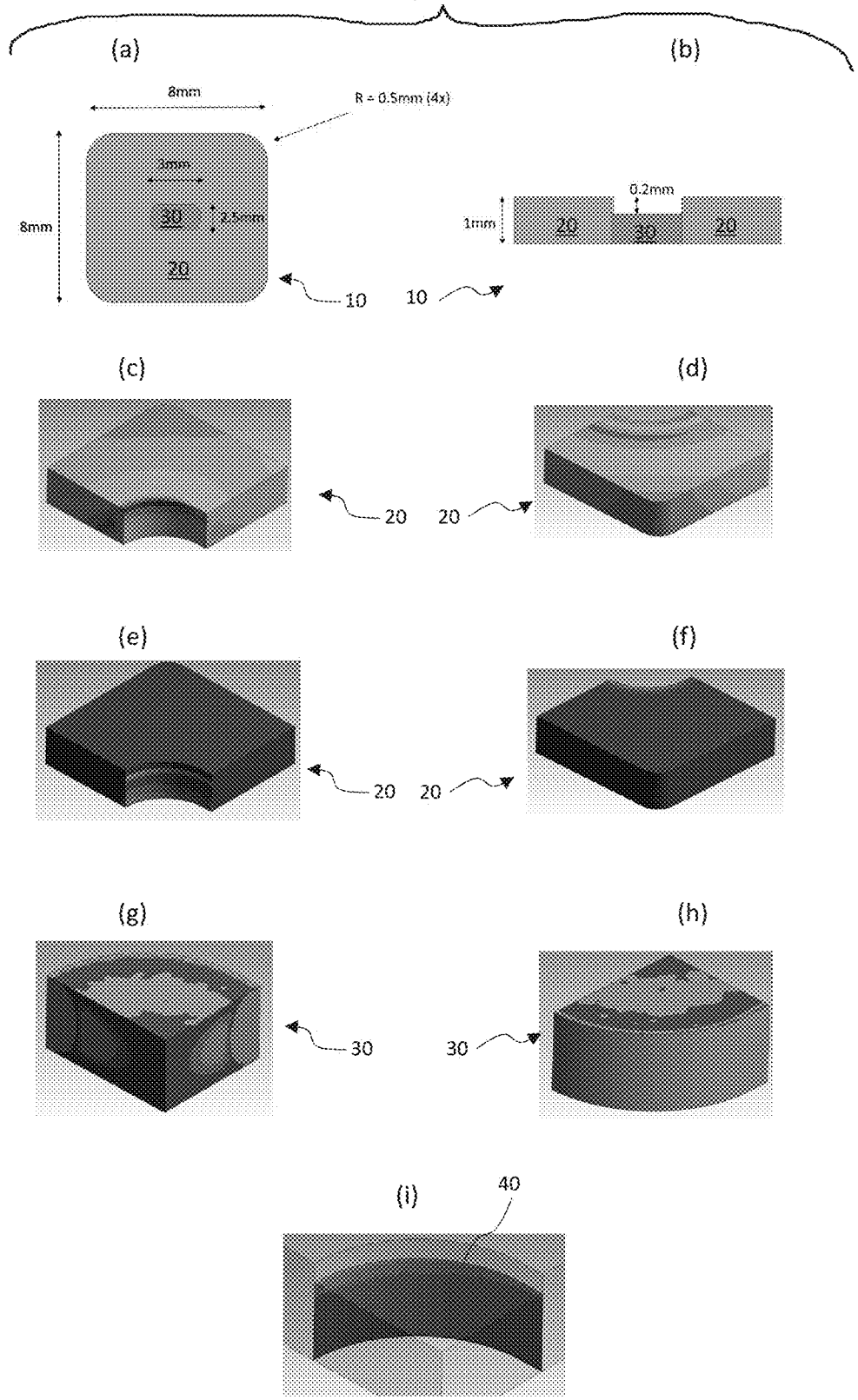
Figure 15:
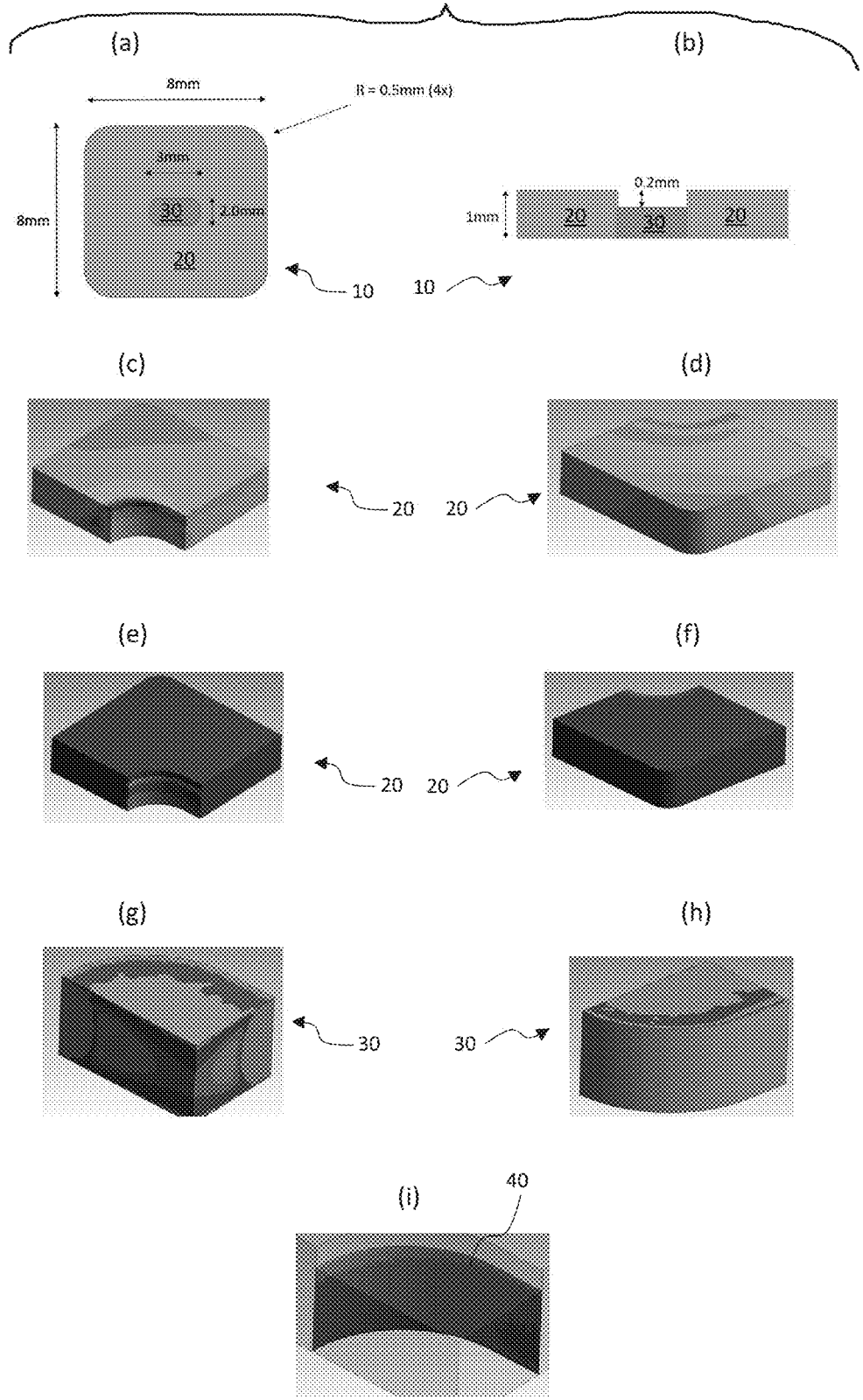
Figure 16:
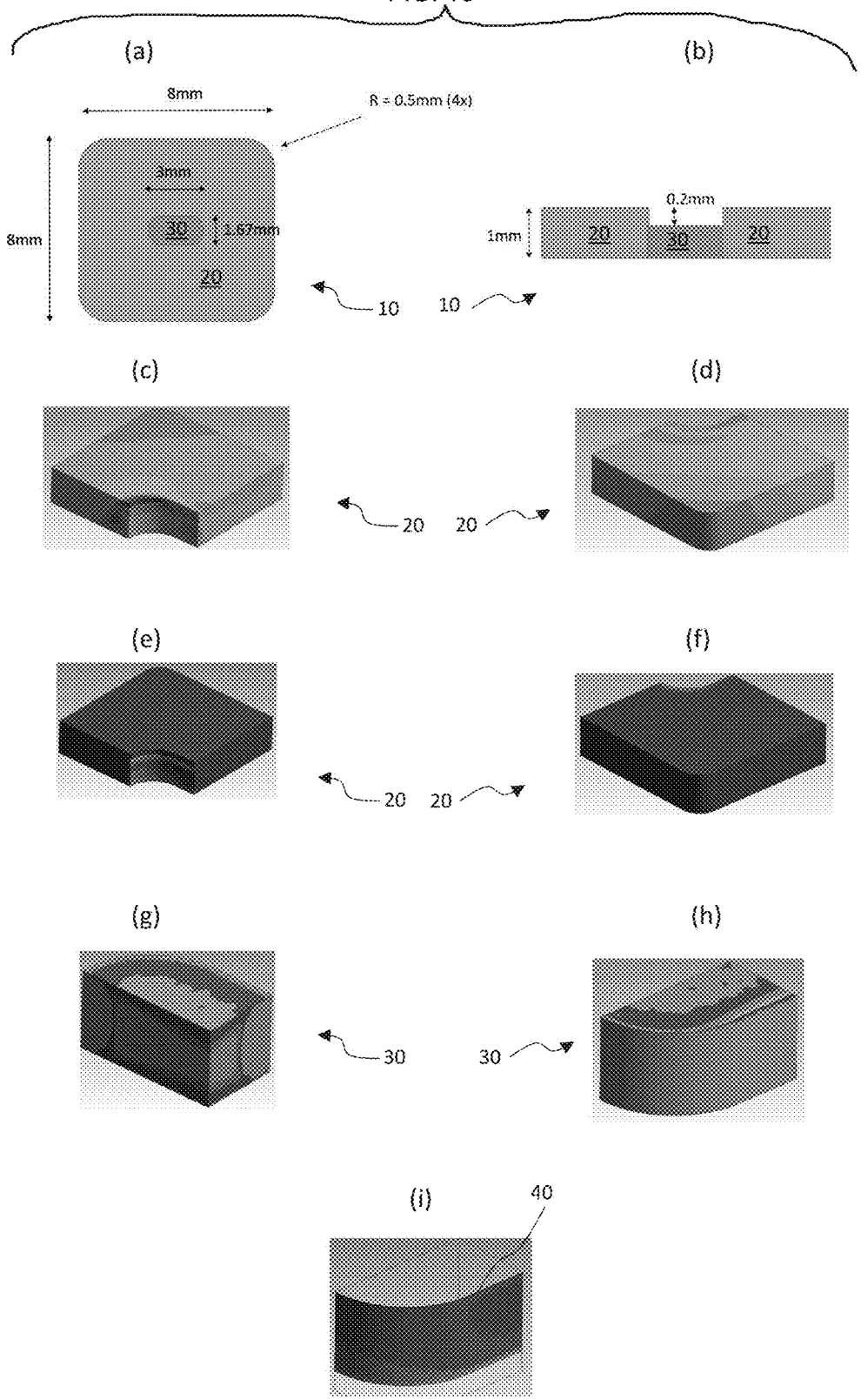
Figure 17:
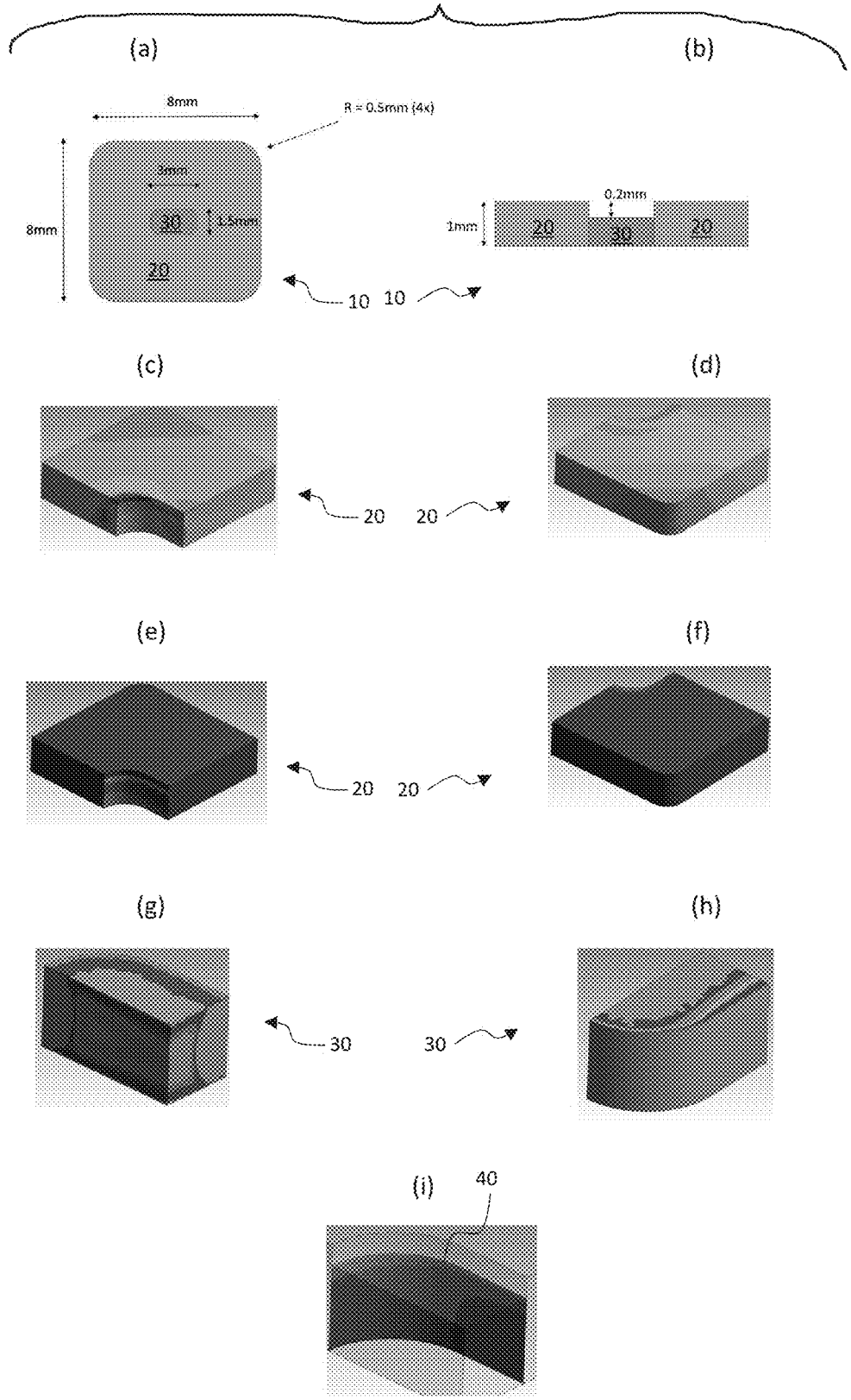

Compared to a rectangular shape with rounded corners, the stress in the glass decreases by orders of magnitude in the case of the pill shape (see FIG. 9, 16).

Figure 18:
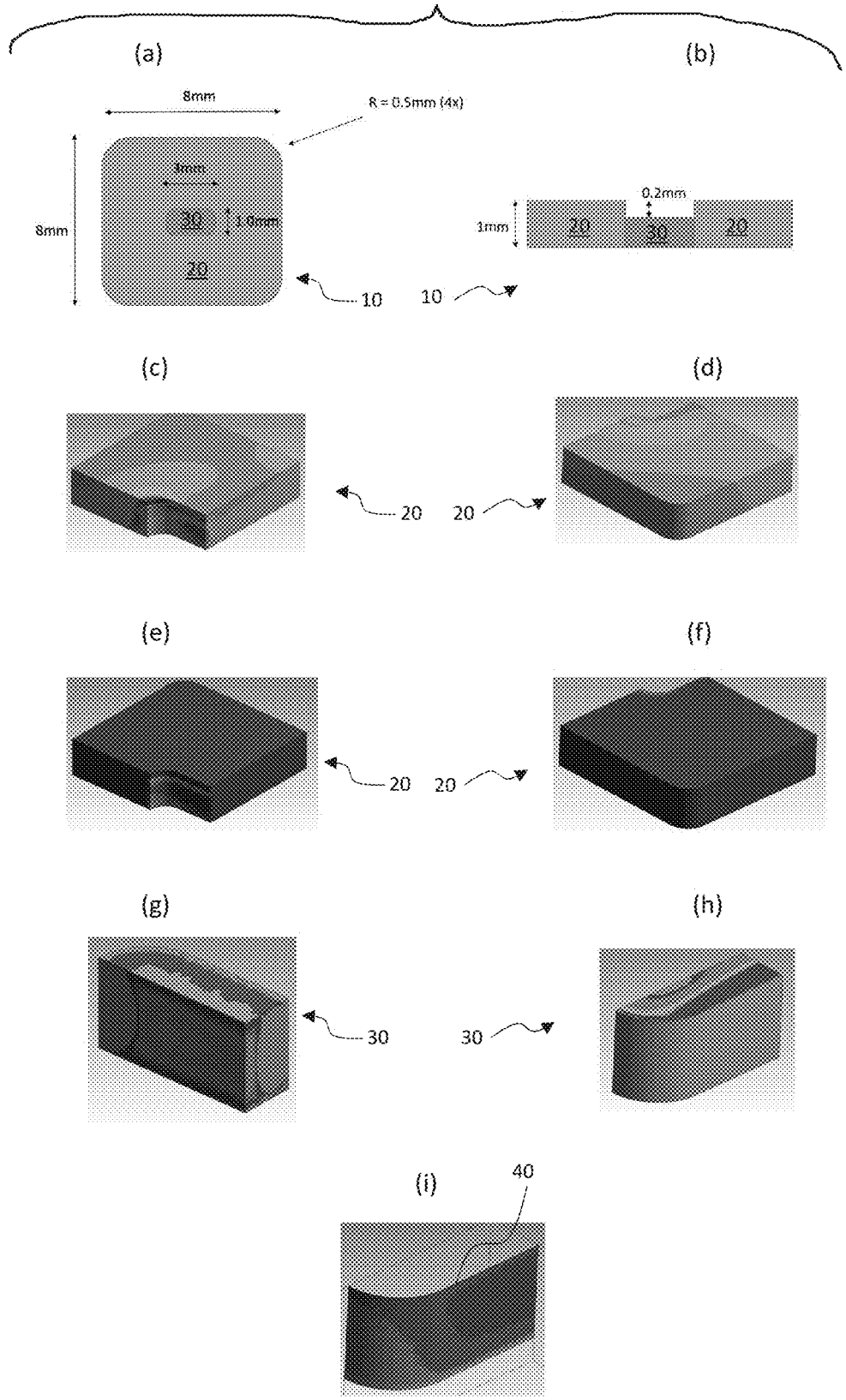

If the side ratio for pill-shaped glass increases to 1:3, the tensile stress on the surface of the glass increases significantly (see FIG. 18).

Figure 19:
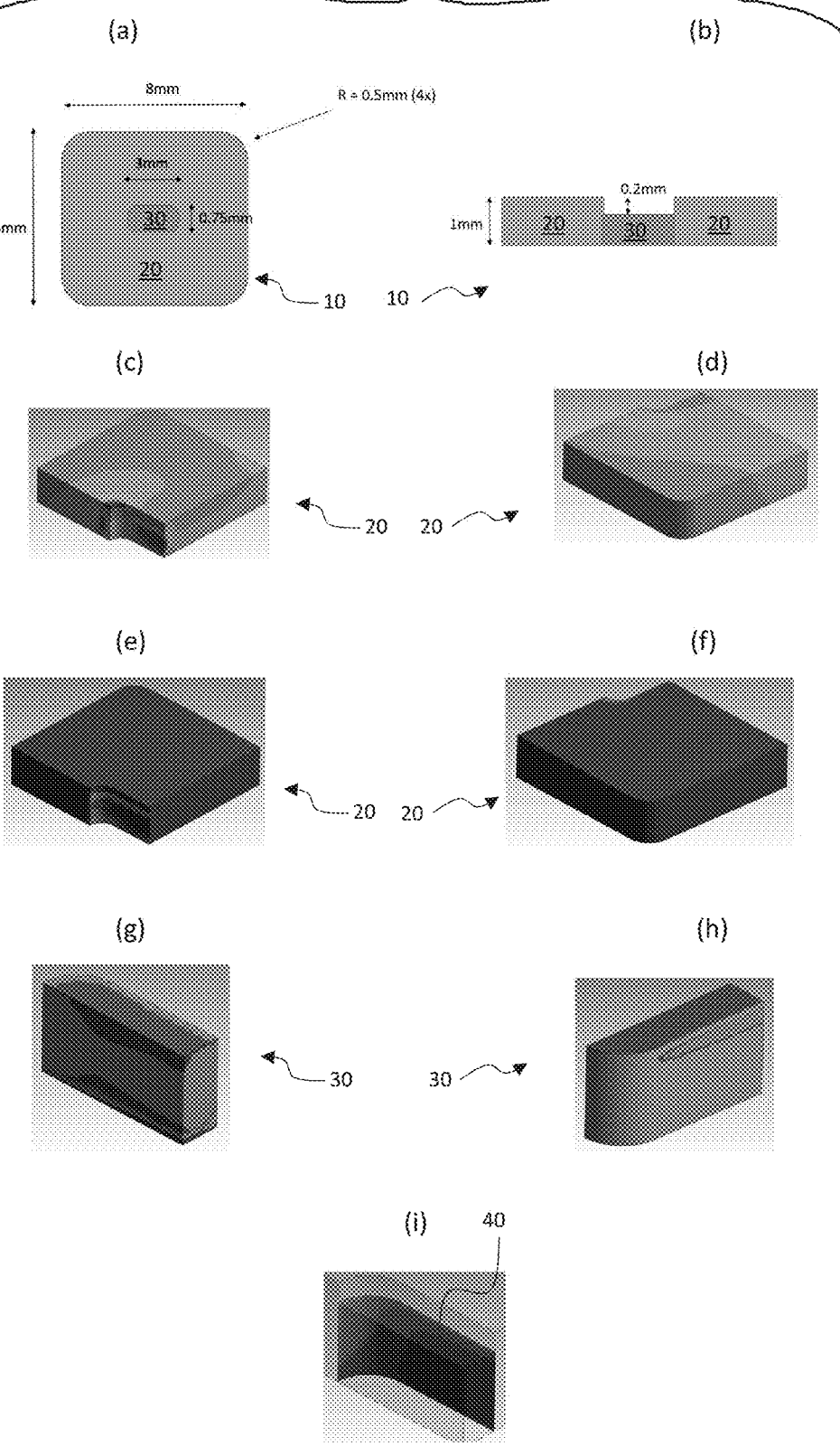
Figure 20:
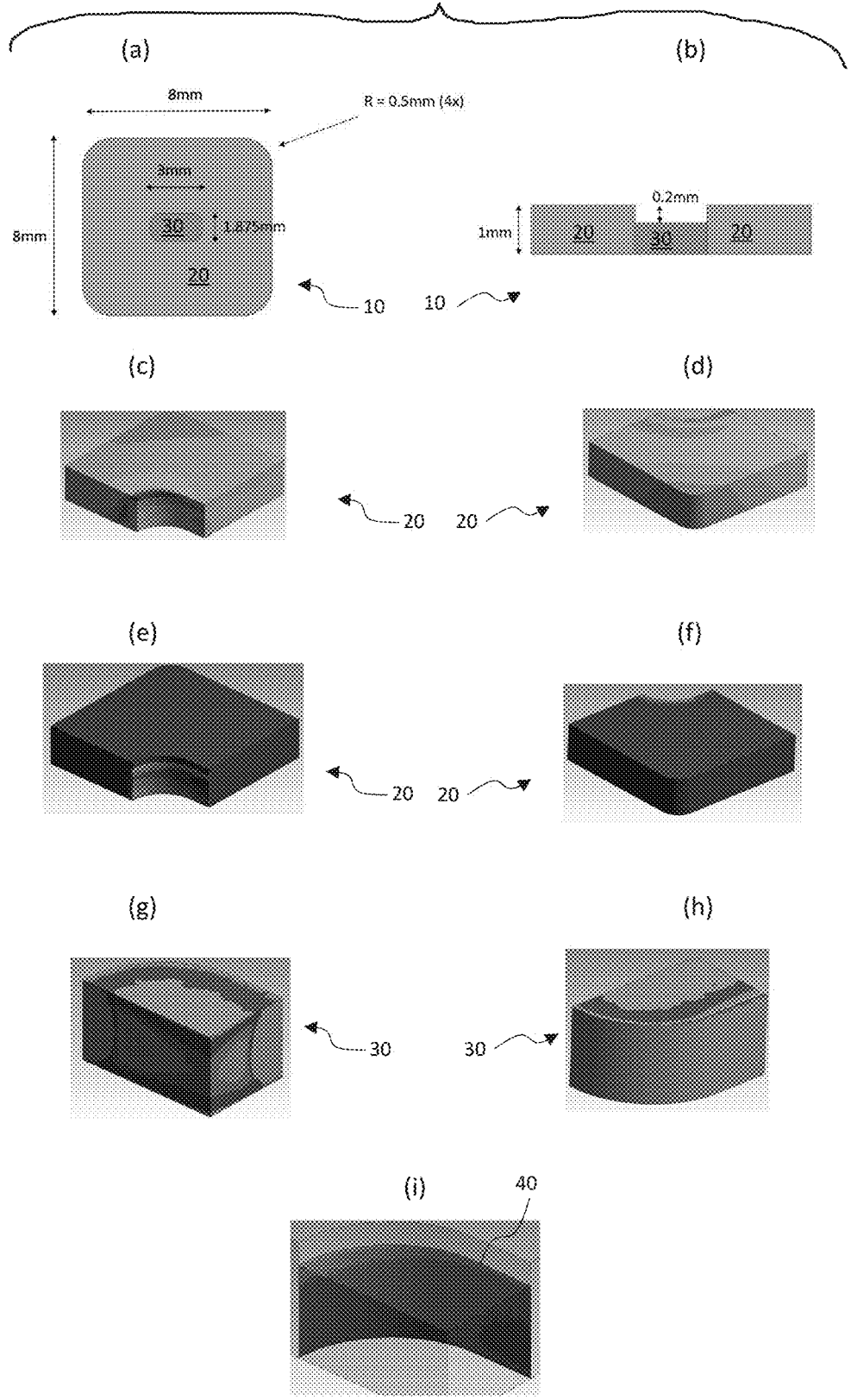
FIG. 20 shows a glass-metal composite element, wherein the inner component including glass has a pill-shaped geometry with a side ratio of 1:1.6 (a) and (b), depicted as in FIG. 1, and representations (c) to (i) corresponding to FIG. 1.

At a side ratio of 1:4, the tensile stress on the glass becomes very great (the entire surface is red) (see FIG. 19).

Even at a side ratio of 1:4, there is, unexpectedly, still a positive contact pressure for the minimum value (see FIG. 19).

In the case of a pill shape, the risk of metal deformation is in the same range as in the case of circular glasses (see configuration 13-22, and FIGS. 13-20).

In a particularly advantageous embodiment, the back cover has more than one window. The side ratio is advantageously from 1.6:1 to 2.0:1 or from 1.7:1 to 1.9:1. In the case of a back cover of steel, in particular stainless steel, advantageously austenitic stainless steel, the minimum spacing between two windows is advantageously from 1.0 to 1.2 times the shorter linear portion.

A particularly advantageous embodiment is a back cover of austenitic stainless steel having more than one window, in which the side ratio is 1.8:1 and the minimum spacing between two windows is 2.0 mm. The material thickness of the back cover is here advantageously from 0.7 mm to 1 mm at least at the edge of the window.

The minimum spacing is the smallest value of the spacing between two windows.

In the case of a glass-metal composite element having an electrical conductor extending through the inner component, both the contour line 40 between the outer holder 20 and the inner component 30 and the second contour line 60 between the inner component 30 and the electrical conductor 50 being each defined by a plurality of linear portions which are connected together by radii 40R, 60R, it can be provided that there is an equal distance between the contour lines 40, 60, that is to say the inner component has the same width, along the entirety of the contour lines 40, 60 (FIG. 28a).

This means in particular that the radius 60R of the second contour line 60 (and thus of the electrical conductor) is smaller than the radius 40R of the contour line 40 (and thus of the inner component). It would here actually be expected that, owing to the smaller radius of the electrical conductor 50, there is a lower tensile stress in the region between the electrical conductor and the inner component and/or that, owing to the larger radius of the inner component, a higher compressive stress is exerted by the outer holder on the inner component and the electrical conductor. Thus, a particular advantage is actually to be expected when the radius 40R of the contour line 40 is smaller than the radius 60R of the second contour line 60.

Surprisingly, however, it has been found that it is more advantageous if the radii 40R and 60R differ from one another by less than a factor of 5, in particular differ from one another by less than a factor of 3, in particular differ from one another by less than a factor of 2, in particular differ from one another by less than a factor of 1.5, in particular differ from one another by less than a factor of 1.25 or even are identical (FIG. 28b).

Surprisingly, the tensile stress of the electrical conductor can in this case be compensated for or negated by the compressive stress of the outer component on the system including the inner component and the electrical conductor (where the geometry is identical, it is even possible to eliminate these stresses directly). Thus, in a particularly advantageous manner, a higher compressive stress and/or a lower minimum contact stress can be achieved.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A composite element, comprising:
an outer holder; and
an inner component which is held in the outer holder under a compressive stress, the outer holder and the inner component adjoining one another along a contour line which is closed, the contour line including two linear portions and two connecting portions, the two linear portions opposing one another and extending in a straight line, the two connecting portions connecting the two linear portions to form the contour line as closed, at least one of the two connecting portions having an arcuately extending curved region, wherein the outer holder comprises or consists of a first material which has a first coefficient of thermal expansion, the inner component comprises or consists of a second material which has a second coefficient of thermal expansion, and the first coefficient of thermal expansion is greater than the second coefficient of thermal expansion, and wherein a contact pressure along the contour line is positive at all points, and a stress on the inner component along the contour line is less than 300 MPa.

2. The composite element according to claim 1, wherein the arcuately extending curved region is a first arcuately extending curved region, the at least one of the two connecting portions including the first arcuately extending curved region and a second arcuately extending curved region, the first arcuately extending curved region directly adjoining one of the two linear portions, the second arcuately extending curved region directly adjoining the other of the two linear portions.

3. The composite element according to claim 1, wherein a length of the arcuately extending curved region is at least 5% of a length of the at least one of the two connecting portions.

4. The composite element according to claim 1, wherein the at least one of the two connecting portions is formed as the arcuately extending curved region, which is a continuously arcuately extending curved region.

5. The composite element according to claim 1, wherein a smallest possible enveloping rectangle which surrounds the contour line comprises a first side length and a second side length, the first side length extending parallel to at least one of the two opposing linear portions, the second side length extending orthogonal to the first side length.

6. The composite element according to claim 1, wherein at least one of:
(a) the arcuately extending curved region of the at least one of the two connecting portions merges into at least one of the two linear portions smoothly; and
(b) the contour line extends smoothly at all points.

7. The composite element according to claim 1, wherein at least one of:
(a) a contact pressure along the contour line is greater than 100 MPa at least one point;
(b) a stress on the outer holder along the contour line is less than 300 MPa; and
(c) a deformation of the outer holder is less than 0.03 mm/mm.

8. A composite element, comprising:
an outer holder;
an inner component which is held in the outer holder under a compressive stress, the outer holder and the inner component adjoining one another along a contour line which is closed, the contour line including two linear portions and two connecting portions, the two linear portions opposing one another and extending in a straight line, the two connecting portions connecting the two linear portions to form the contour line as closed, at least one of the two connecting portions having an arcuately extending curved region; and
an electrical conductor which extends through the inner component, wherein the contour line is a first contour line, the inner component and the electrical conductor adjoining one another along a second contour line which is closed, wherein the outer holder comprises or consists of a first material which has a first coefficient of thermal expansion, wherein the inner component comprises or consists of a second material which has a second coefficient of thermal expansion, wherein the electrical conductor comprises or consists of a third material which has a third coefficient of thermal expansion, wherein at least one of: (a) the third coefficient of thermal expansion differs from the second coefficient of thermal expansion by less than a factor of 3; and
(b) the third coefficient of thermal expansion differs from the first coefficient of thermal expansion by less than a factor of 3.

9. A composite element, comprising:
an outer holder;
an inner component which is held in the outer holder under a compressive stress, the outer holder and the inner component adjoining one another along a contour line which is closed, the contour line including two linear portions and two connecting portions, the two linear portions opposing one another and extending in a straight line, the two connecting portions connecting the two linear portions to form the contour line as closed, at least one of the two connecting portions having an arcuately extending curved region; and
an electrical conductor which extends through the inner component, wherein the contour line is a first contour line, the inner component and the electrical conductor adjoining one another along a second contour line which is closed,
wherein the contour line along which the outer holder and the inner component adjoin one another defines a smallest possible first enveloping rectangle which surrounds the contour line,
wherein the second contour line along which the inner component and the electrical conductor adjoin one another defines a smallest possible second enveloping rectangle which surrounds the second contour line,
wherein the smallest possible first enveloping rectangle includes a longer side length and a shorter side length, and the smallest possible second enveloping rectangle includes a longer side length and a shorter side length, and
wherein the longer side length of the smallest possible first enveloping rectangle and the longer side length of smallest possible second enveloping rectangle extend parallel to one another or extend at an angle to one another which is smaller than 20 degrees.

10. The composite element according to claim 9, wherein the longer side length of the smallest possible first enveloping rectangle is greater than the shorter side length of the smallest possible first enveloping rectangle by a first factor, and
wherein the longer side length of the smallest possible second enveloping rectangle is greater than the shorter side length of the smallest possible second enveloping rectangle by a second factor, and wherein the second factor differs from the first factor by less than 400%.

11. The composite element according to claim 8, wherein the second contour line along which the inner component and the electrical conductor adjoin one another comprises two linear portions and two connecting portions, the two linear portions opposing one another and extending in a straight line, the two connecting portions connecting the two linear portions to form the second contour line as closed, at least one of the two connecting portions of the second contour line having an arcuately extending curved region.

12. The composite element according to claim 11, wherein, in respect of the second contour line along which the inner component and the electrical conductor adjoin one another, the arcuately extending curved region of the second contour line is a first arcuately extending curved region of the second contour line, the at least one of the two connecting portions of the second contour line including the first arcuately extending curved region of the second contour line and a second arcuately extending curved region of the second contour line, the first arcuately extending curved region of the second contour line directly adjoining one of the two linear portions of the second contour line, the second arcuately extending curved region of the second contour line directly adjoining the other of the two linear portions of the second contour line.

13. The composite element according to claim 11, wherein, in respect of the second contour line along which the inner component and the electrical conductor adjoin one another, a length of the arcuately extending curved region of the second contour line is at least 5% of a length of the at least one of the two connecting portions of the second contour line.

14. The composite element according to claim 11, wherein, in respect of the second contour line along which the inner component and the electrical conductor adjoin one another, the at least one of the two connecting portions of the second contour line is formed as the arcuately extending curved region of the second contour line, which is a continuously arcuately extending curved region.

15. The composite element according to claim 11, wherein a smallest possible enveloping rectangle which surrounds the second contour line comprises a first side length and a second side length, the first side length extending parallel to at least one of the two opposing linear portions of the second contour line, the second side length extending orthogonal to the first side length.

16. The composite element according to claim 11, wherein, in respect of the second contour line along which the inner component and the electrical conductor adjoin one another, at least one of:

(a) the arcuately extending curved region of the at least one of the two connecting portions merges into at least one of the two linear portions smoothly; and (b) the second contour line extends smoothly at all points.

17. The composite element according to claim 11, wherein the first contour line along which the outer holder and the inner component adjoin one another defines a first curved portion, and wherein the second contour line along which the inner component and the electrical conductor adjoin one another defines a second curved portion, and wherein a distance between the first contour line and the second contour line is greater in a region of the first curved portion and the second curved portion than in a region of a portion of the first contour line and a portion of the second contour line that is less curved or not curved.

18. The composite element according to claim 11, wherein the first contour line along which the outer holder and the inner component adjoin one another defines a first radius, and wherein the second contour line along which the inner component and the electrical conductor adjoin one another defines a second radius, and wherein a ratio between the first radius and the second radius is less than 10.

19. The composite element according to claim 11, wherein the first contour line, along which the outer holder and the inner component adjoin one another, and the second contour line, along which the inner component and the electrical conductor adjoin one another, are at a constant distance from one another along an entirety of the first contour line and the second contour line except at a plurality of curved regions of the first contour line and the second contour line including the arcuately extending curved region of the first contour line and the arcuately extending curved region of the second contour line, and wherein at the plurality of curved regions of the first contour line and the second contour line a distance between the first contour line and the second contour line is greater.

20. The composite element according to claim 11, wherein:

(a) the composite element includes a first side and a second side, and wherein the electrical conductor extends through the inner component from the first side of the composite element to the second side of the composite element; or (b) the composite element includes a first side and a second side, and wherein the electrical conductor extends through the inner component from the first side of the composite element to the second side of the composite element, wherein at least one of:

(1) the electrical conductor (i) terminates flush with the inner component on at least one of the first side and the second side of the composite element or (ii) has an offset relative thereto which is smaller than 500 μm; and (2) the electrical conductor protrudes from the inner component on at least one of the first side and the second side of the composite element with an overhang.

21. A composite element, comprising:

an outer holder; and an inner component which is held in the outer holder, the outer holder and the inner component adjoining one another along a contour line which is closed, the contour line being non-circular and curved at least in some portions of the contour line, wherein the outer holder comprises or consists of a first material which has a first coefficient of thermal expansion, the inner component comprises or consists of a second material which has a second coefficient of thermal expansion, and the first coefficient of thermal expansion is greater than the second coefficient of thermal expansion, and wherein a contact pressure along the contour line is positive at all points, and a stress on the inner component along the contour line is less than 300 MPa.

22. A back cover for an electronic device which can be worn on a body, the back cover comprising:

a composite element including:

an outer holder; and an inner component which is held in the outer holder under a compressive stress, the outer holder and the inner component adjoining one another along a contour line which is closed, the contour line including two linear portions and two connecting portions, the two linear portions opposing one another and extending in a straight line, the two connecting portions connecting the two linear portions to form the contour line as closed, at least one of the two connecting portions having an arcuately extending curved region, wherein at least one of:
(a) the back cover is made of steel or stainless steel, and the back cover includes a plurality of windows, wherein a side ratio of the plurality of windows is from 1.4:1 to 2.0:1 or from 1.7:1 to 1.9:1, and a minimum spacing between the plurality of windows is from 1.0 to 1.2 times at least one of the two linear portions that is shorter;
(b) the back cover is made of austenitic stainless steel, and the back cover includes a plurality of windows, wherein a side ratio of the plurality of windows is from 1.4:1 to 2.0:1 or from 1.7:1 to 1.9:1, and a minimum spacing between the plurality of windows is from 1.0 to 1.2 times at least one of the two linear portions that is shorter, wherein the side ratio of the plurality of windows is 1.8:1, and a minimum spacing between the plurality of windows is 2.0 mm; and
(c) the back cover is made of steel or stainless steel, and the back cover includes a plurality of windows, wherein a side ratio of the plurality of windows is from 1.4:1 to 2.0:1 or from 1.7:1 to 1.9:1, and a minimum spacing between the plurality of windows is from 1.0 to 1.2 times at least one of the two linear portions that is shorter, wherein the back cover, at least in a region of the back cover around the plurality of windows, has a thickness of from 0.7 mm to 1 mm or a thickness of 0.8 mm.

* * * * *